US011145377B2

(12) United States Patent
Schatzberger et al.

(10) Patent No.: US 11,145,377 B2
(45) Date of Patent: Oct. 12, 2021

(54) MEMORY ARRANGEMENT AND METHOD FOR OPERATING OR TESTING A MEMORY ARRANGEMENT

(71) Applicant: ams AG, Premstaetten (AT)

(72) Inventors: Gregor Schatzberger, Graz (AT); Friedrich Peter Leisenberger, Graz (AT); Peter Sarson, Graz (AT)

(73) Assignee: AMS AG, Premstaetten (AT)

( * ) Notice: Subject to any disclaimer, the term of this patent is extended or adjusted under 35 U.S.C. 154(b) by 191 days.

(21) Appl. No.: 16/488,745

(22) PCT Filed: Feb. 27, 2018

(86) PCT No.: PCT/EP2018/054836
§ 371 (c)(1),
(2) Date: Aug. 26, 2019

(87) PCT Pub. No.: WO2018/158265
PCT Pub. Date: Sep. 7, 2018

(65) Prior Publication Data
US 2020/0051650 A1    Feb. 13, 2020

(30) Foreign Application Priority Data

Feb. 28, 2017 (EP) .................................. 17158340

(51) Int. Cl.
*G11C 16/04* (2006.01)
*G11C 16/34* (2006.01)
(Continued)

(52) U.S. Cl.
CPC ...... *G11C 16/3495* (2013.01); *G11C 16/0483* (2013.01); *G11C 16/08* (2013.01); *G11C 29/38* (2013.01)

(58) Field of Classification Search
CPC . G11C 16/3495; G11C 16/0483; G11C 16/08; G11C 29/38; G11C 29/76; G11C 2029/5006; G11C 29/50004
See application file for complete search history.

(56) References Cited

U.S. PATENT DOCUMENTS

| 4,963,825 | A |   | 10/1990 | Mielke |
|-----------|---|---|---------|--------|
| 5,513,144 | A | * | 4/1996  | O'Toole ................. G11C 29/04 365/200 |

(Continued)

FOREIGN PATENT DOCUMENTS

| DE | 102008014123 | 9/2015 |
| EP | 0686978      | 3/2001 |

OTHER PUBLICATIONS

European Search Report, International Search Report for PCT/EP2018/054836, dated May 29, 2018.

*Primary Examiner* — Mohammed A Bashar
(74) *Attorney, Agent, or Firm* — MH2 Technology Law Group LLP

(57) ABSTRACT

A memory arrangement comprises a non-volatile memory plane (2), a replacement plane (3), an address select block (302), and a counter arrangement (300) having at least one counter (310 to 312). The at least one counter (310 to 312) is configured to be incremented at a write cycle of the memory arrangement (1). The address select block (302) is configured to switch from the non-volatile memory plane (2) to the replacement plane (3), if a counter value of the at least one counter (310 to 312) is higher than a predetermined limit.

7 Claims, 12 Drawing Sheets

(51) Int. Cl.
*G11C 16/08* (2006.01)
*G11C 29/38* (2006.01)

(56) References Cited

U.S. PATENT DOCUMENTS

| | | |
|---|---|---|
| 8,189,409 B2 | 5/2012 | Fellner et al. |
| 8,537,586 B2 | 9/2013 | Schatzberger et al. |
| 9,741,421 B1 * | 8/2017 | Hedden .................. G11C 29/76 |
| 2005/0235131 A1 | 10/2005 | Ware |
| 2008/0183952 A1 | 7/2008 | Rikitake |
| 2009/0044085 A1 | 2/2009 | Zeng |
| 2009/0138654 A1 | 5/2009 | Sutardja |
| 2009/0256128 A1 | 10/2009 | Lee et al. |
| 2010/0220517 A1 * | 9/2010 | Okayama .................. G11C 7/20 |
| | | 365/158 |
| 2017/0092371 A1 * | 3/2017 | Harari .................. G11C 11/5628 |
| 2018/0341418 A1 * | 11/2018 | Ki .......................... G11C 29/52 |

* cited by examiner

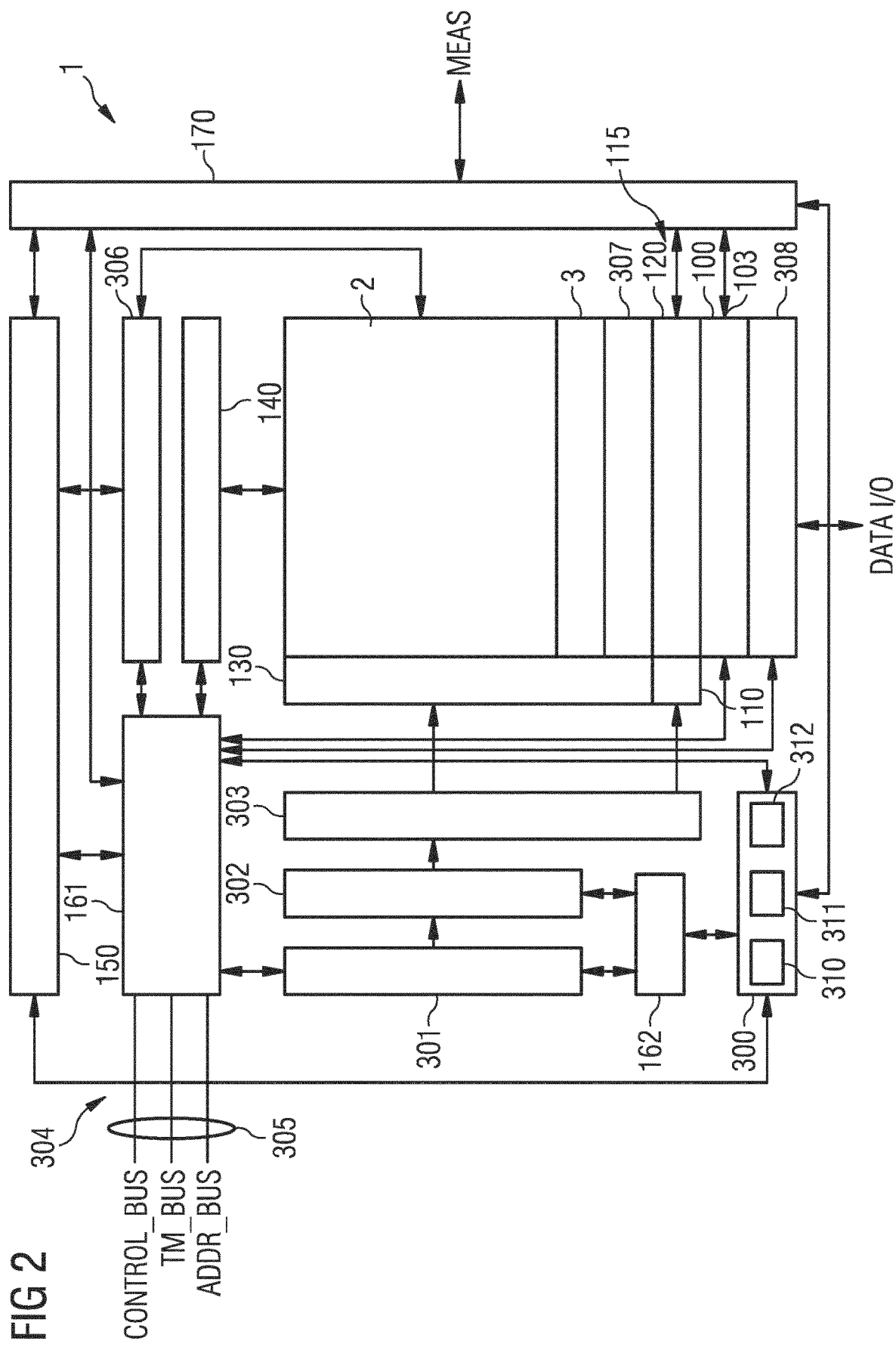

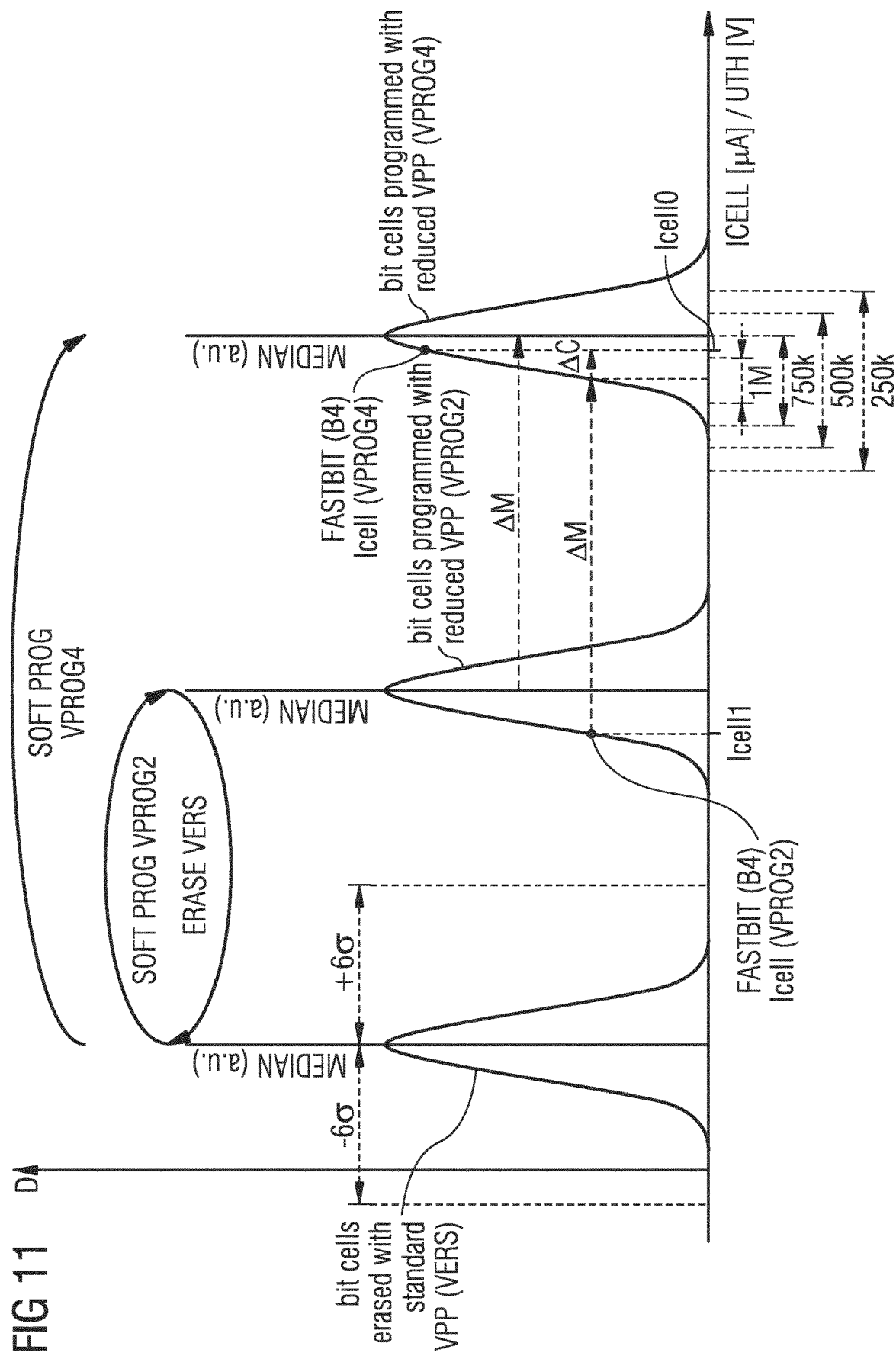

MEMORY ARRANGEMENT AND METHOD FOR OPERATING OR TESTING A MEMORY ARRANGEMENT

CROSS-REFERENCE TO RELATED APPLICATIONS

The present application is the national stage entry of International Patent Application No. PCT/EP2018/054836, filed on Feb. 27, 2018, which claims the benefit of priority of European Patent Application No. 17158340.4, filed on Feb. 28, 2017, all of which are hereby incorporated by reference in their entirety for all purposes.

BACKGROUND OF THE INVENTION

The present patent application is related to a memory arrangement, a method for operating a memory arrangement and a method for testing a memory arrangement.

Memory arrangements often comprise non-volatile bit cells. The bit cells can withstand a high number of endurance cycles. Failures of bit cells typically limit the lifetime of a memory arrangement.

SUMMARY OF THE INVENTION

In an embodiment, a memory arrangement comprises a non-volatile memory plane, a replacement plane, an address select block and a counter arrangement having at least one counter. The at least one counter is configured to be incremented at a write cycle of the memory arrangement. The address select block is configured to switch from the non-volatile memory plane to the replacement plane, if a counter value of the at least one counter is higher than a predetermined limit.

Advantageously, information is stored in the non-volatile memory plane from a first write cycle up to the predetermined limit of write cycles and information is stored in the replacement plane for write cycles exceeding the predetermined limit. The address select block is coupled to the non-volatile memory plane, the replacement plane and the counter arrangement. The non-volatile memory plane can also be named non-volatile memory array. The replacement plane can also be called replacement array. A bit cell can also be named memory cell.

In an embodiment, the at least one counter is incremented at each write cycle of a preselected bit cell of the non-volatile memory plane. The address select block switches from the preselected bit cell of the non-volatile memory plane to a replacement bit cell of the replacement plane, if the counter value of the at least one counter is higher than the predetermined limit.

Advantageously, the write cycles of only the preselected bit cell is counted by the at least one counter, since only the write cycles of this preselected bit cell and not the write cycles of the non-volatile memory plane are responsible for a failure of this preselected bit cell.

In an embodiment, the counter arrangement comprises a first number N of counters. The non-volatile memory plane comprises a second number M of preselected bit cells.

In an embodiment, the memory arrangement comprises an address replacement plane that stores the addresses of the second number M of preselected bit cells.

In an embodiment, the addresses of the second number M of preselected bit cells are determined in a test phase.

In an embodiment, the memory arrangement comprises the address replacement plane storing the address of the preselected bit cell and the address of the replacement bit cell. The address select block is coupled to the address replacement plane. The address replacement plane can be named address replacement array.

In an embodiment, the memory arrangement additionally comprises an information about the predetermined limit. The address replacement plane may store the value of the predetermined limit itself or may store an information that is a function of the predetermined limit. This information may be an information about a cycle class.

In an embodiment, the address replacement plane additionally stores a status bit indicating when the replacement bit cell is used instead of the preselected bit cell.

In an embodiment, the second number M is equal or smaller than the first number N. One of the first number N of counters is incremented at each write cycle of a corresponding preselected bit cell of the second number M of preselected bit cells. The address select block switches from the preselected bit cell of the non-volatile memory plane to the corresponding replacement bit cell of the replacement plane, if the counter value of said counter is higher than a predetermined limit corresponding to said preselected bit cell.

Advantageously, the preselected bit cell of the non-volatile memory plane is used for the first write cycle up to the predetermined limit and then the corresponding replacement bit cell of the replacement plane is used for the write cycles exceeding the predetermined limit.

In an embodiment, the address replacement plane stores the addresses of the second number of replacement bit cells.

In an embodiment, the predetermined limits of write cycles are equal. Each preselected bit cell is switched to the corresponding replacement bit cell at the same counter value. Thus, the bit cells are grouped into two cycle classes.

In a further development, the address replacement plane additionally stores an information about the second number of predetermined limits.

In an embodiment, at least two of the second number of predetermined limits are different. For example, some of the second number M of the preselected bit cells have a first predetermined limit of write cycles and the other of the second number M of the preselected bit cells have a second predetermined limit of write cycles. Thus, the bit cells are classified into three cycle classes.

Alternatively, more than two predetermined limits of write cycles are set such as three or four predetermined limits.

In an embodiment, the addresses of the second number M of preselected bit cells are determined in a test phase. In the test phase, a method for testing the memory arrangement is performed. Said method is described below. The preselected bit cells are determined in the test phase. The preselected bit cells are not changed after the test phase, for example in an operation phase. The bit cells of the non-volatile memory plane are tested in the test phase to select weak bit cells which are then the preselected bits in the operation phase. A circuit arrangement in which the memory arrangement is inserted does not receive any information about the preselected bit cells and about the switching from a preselected bit cell of the non-volatile memory plane to a replacement bit cell of the replacement memory plane. Said switching is performed automatically by the memory arrangement in the operation phase.

In an embodiment, the memory arrangement replaces a byte of the non-volatile memory plane comprising the preselected bit cell by a byte of the replacement plane comprising the replacement bit cell. The byte of the non-volatile memory plane comprising the preselected bit cell may be named preselected byte. The byte of the replacement plane comprising the replacement bit cell may be called replacement byte. The memory arrangement performs a byte replacement strategy.

The address replacement plane may store the address of the preselected byte and of the replacement byte. Thus, the address replacement plane may store the addresses of the second number of preselected bytes and of the second number of replacement bytes.

In an embodiment, a method for operating a memory arrangement comprises storing information in a non-volatile memory plane in a write cycle, counting the write cycle by at least one counter of a counter arrangement, and storing further information in a replacement plane, if a counter value of the at least one counter is higher than a predetermined limit, and in the non-volatile memory plane, if the counter value of the at least one counter is equal or lower than the predetermined limit.

Advantageously, information is redirected from the non-volatile memory plane to the replacement plane in case the counter value is over the predetermined limit of write cycles.

In an embodiment, there is no switching from the complete non-volatile memory plane to the replacement plane, but a switching from one preselected bit cell of the non-volatile memory plane to one replacement bit cell of the replacement plane or a switching from one preselected byte of the non-volatile memory plane to one replacement byte of the replacement plane in case the counter value is over the predetermined limit.

In an embodiment, the counter arrangement comprises a first number N of counters. The non-volatile memory plane comprises a second number M of preselected bit cells.

In an embodiment, the memory arrangement comprises an address replacement plane that stores the addresses of the second number M of preselected bit cells.

In an embodiment, the addresses of the second number M of preselected bit cells are determined in a test phase. Advantageously, since the weak bit cells are determined in the test phase, there is no necessity to count write cycles of bit cells which have a high endurance. Only the write cycles of preselected bit cells are counted. Therefore, the number of counters can be minimized.

In an embodiment, a method for testing a memory arrangement comprises determining the address of a bit cell by an erase test and/or a program test of the bit cells of a non-volatile memory plane of the memory arrangement, storing the address of this bit cell as a preselected bit cell in an address replacement plane of the memory arrangement and storing of an address of a replacement bit cell of a replacement plane of the memory arrangement in the address replacement plane.

In an embodiment, a replacement bit cell is set for each preselected bit cell.

In an embodiment, one erase test and one program test is performed. Thus, some of the preselected bit cells are selected due to the erase test and other of the preselected bit cells are selected due to the program test. It is not necessary that a bit cell fails both tests to be set as preselected bit cell. Only a bit cell that fails in at least one of the erase test and the program test is selected as a preselected bit cell. Each bit cell that does not meet a test criteria in at least one of the erase test and the program test is selected as a preselected bit cell. Advantageously, the method for testing determines fast erase bit cells and fast programming bit cells. Each individual bit cell of the non-volatile memory plane is tested.

In an embodiment, the method for testing is performed in a test phase. The test phase may be performed by the fabricating company of the memory arrangement. The erase test and the program test are performed in the test phase.

In an embodiment, an information about a predetermined limit of write cycles is stored for each preselected bit cell in the address replacement plane depending on the result of the erase test and on the result of the program test of said preselected bit cell. This predetermined limit of write cycles is used as in an operation phase of the memory arrangement.

In an embodiment, an erase test of a bit cell is performed by
   programming the bit cell by a program pulse,
   determining a first value of a bit cell current flowing through the bit cell,
   providing an erase pulse to the bit cell,
   determining a second value of the bit cell current flowing through the bit cell and
   setting the bit cell as a preselected bit cell, if the difference between the first value and the second value is outside of a first predetermined current range.

In an embodiment, a program test of a bit cell is performed by
   erasing the bit cell,
   determining a first value of a bit cell current flowing through the bit cell,
   providing a programming pulse to the bit cell,
   determining a second value of the bit cell current flowing through the bit cell and
   setting the bit cell as a preselected bit cell, if the difference between the first value and the second value is outside of a first predetermined current range.

In an embodiment, the predetermined limit of write cycles has a first value, when the difference is outside of the first predetermined current range and inside a second predetermined current range, and the predetermined limit of write cycles has a second value that is smaller than the first value, when the difference is outside of the second predetermined current range.

The first predetermined current range in case of the erase test may be equal or may be different from the first predetermined current range of the program test.

The memory arrangement may be realized as EEPROM.

In an embodiment, the memory arrangement performs a high efficient low cost EEPROM screening which enables area optimized dynamic byte error correction.

A non-volatile memory is abbreviated as NVM. A high reliability NVM technology uses an advanced screening method to screen out weak bit cells. In combination with a standard error correction code method, abbreviated ECC method, a NVM may be produced which withstand more than 50 k endurance cycles at 150° C. and a data retention of 10 years at 150° C. Both the number of endurance cycles plus the data retention are defining the life time of a NVM memory.

The NVM screening method can predict the number of endurance cycles the non-volatile memory can withstand in the field. This prediction method is used to filter out material which will fail within the specified number of endurance cycles. If an ECC is used the number of endurance cycles can be secured or even extended depending on the application. For an automotive application the ECC is turned off during the NVM screening according to an ACQ standard to avoid that the ECC covers unwanted process related yield losses. ECC should only cover potential failures activated in the field over the lifetime of the NVM.

After passing successfully the NVM screening only random distributed intrinsic failures will be activated during the lifetime of the NVM. After standard screening of the NVM bit cells only a few intrinsic failures will be activated before the memory enters the wear out region and the bit cells start to collapse at a higher rate. The described screening methodology may be capable to predict the lifetime of each single NVM bit cell in the memory array and find the exact location of weak bit cells with an acceptable test time increase.

To extend the number of endurance cycle a byte replacement strategy is shown which may e.g. increase the number of endurance cycles by a factor of 20 with an area overhead in the range of 5% of the NVM memory plane.

The screening procedure is based on the fact that weak NVM bit cells can be erased faster compared to standard produced bit cells. This effect can be tested in two possible ways. The first possibility is to have a fixed erase time and the erase operation is executed at different erase voltages or the erase voltage is fixed and the erase time is varied. Both methods show the similar results.

The threshold voltages of well-produced NVM bit cells are showing a Gaussian distribution. If all bit cells are produced having lower reliability and therefore having less endurance cycles the erase of such cells takes place at a lower erase voltage which leads to a tail in the distribution of threshold voltages. Depending on the number of bit cells in the tail the endurance performance of the NVM memory can be predicted. Thus, weak bit cells can be screened out without stressing the NVM and therefore reducing the life time of the NVM due to test conditions.

A screening can be performed by testing the NVM with two or three different shorter erase pulses compared to the standard erase pulse. After each short test erase pulse the memory is readout with the sense amplifier arrangement. If a bit cell is already erased a bit replacement algorithm is used to overcome the early endurance fails. The exact number where the bit cell will fail cannot be predicted but by replacing the weak bit cells the number of endurance cycle stated in the datasheet may be achieved.

In an embodiment, the lifetime for each address is determined. In case the lifetime does not correspond to a predetermined limit, the address is dynamically replaced by a replacement address. The replacement addresses are also tested. In other words, the lifetime for each bit cell is determined. In case the lifetime of a bit cell does not exceed the predetermined limit, the bit cell is dynamically replaced by a replacement bit cell. The replacement bit cells are also tested.

In an embodiment, the predetermined limits are not uniform or equal for each of the addresses. Only preselected bit cells which are predetermined in the test phase are watched during the operation phase. Most of the bit cells are not watched after a successful test. Only bit cells that were recognized during the test are watched during the operation phase and are replaced, when the maximum of write cycles is passed. The operation phase follows the test phase.

In an embodiment, the replacement bit cells of the replacement plane are fabricated such as the bit cells of the non-volatile memory plane. Thus, the replacement plane is implemented non-volatile.

BRIEF DESCRIPTION OF THE DRAWINGS

The following description of figures of exemplary embodiments may further illustrate and explain aspects of the invention. Devices and circuit parts with the same structure and the same effect, respectively, appear with equivalent reference symbols. In so far as devices or circuit parts correspond to one another in terms of their function in different figures, the description thereof is not repeated for each of the following figures.

FIG. 2 shows an exemplary embodiment of details of a memory arrangement;

FIGS. 6 to 11 show exemplary embodiments of a method for testing a memory arrangement.

DETAILED DESCRIPTION

Figures 1, 1A:
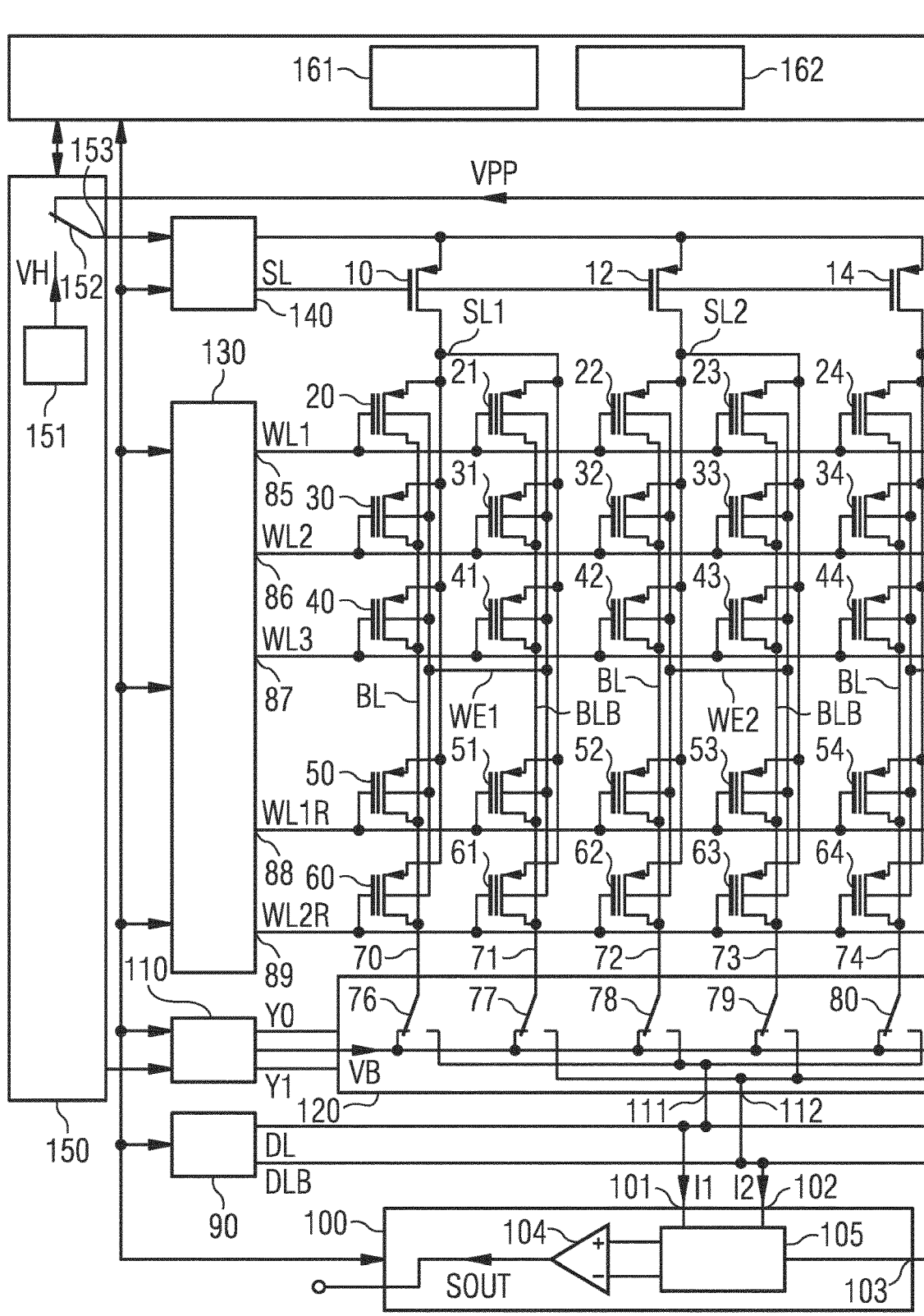
FIG. 1 shows an exemplary embodiment of a memory arrangement.
Figure 1B:
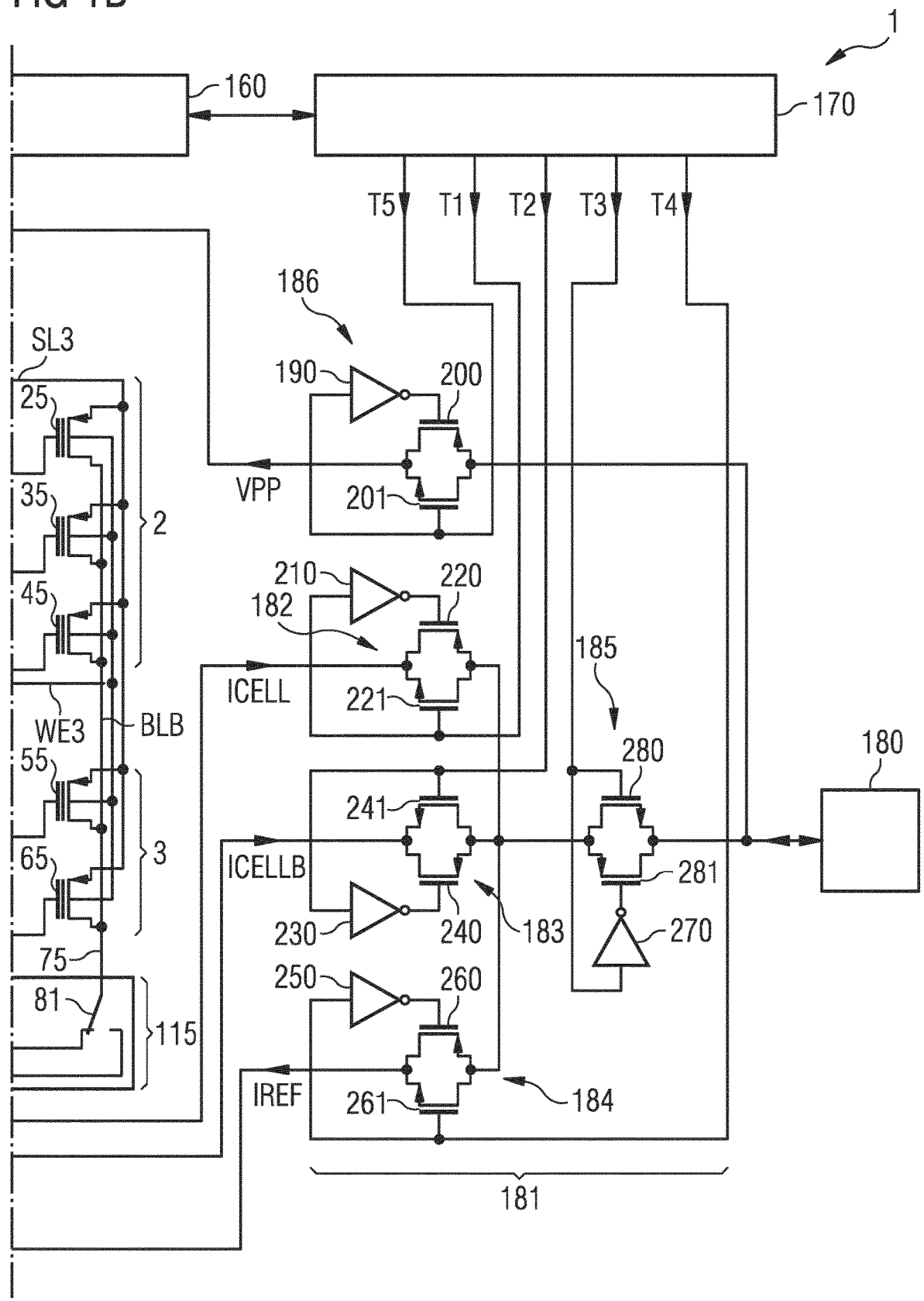

FIG. 1A shows an exemplary embodiment of a memory arrangement 1 comprising a non-volatile memory plane 2, a replacement plane 3, a y-decoder arrangement 115 and a sense amplifier arrangement 100. Both the non-volatile memory plane 2 and the replacement plane 3 are coupled via the y-decoder arrangement 115 to the sense amplifier arrangement 100. Non-volatile memory is shorted to NVM. A plane can also be called array. Thus, the non-volatile memory plane 2 can also be named non-volatile memory array. The replacement plane 3 can also be called replacement array. The NVM plane 2 comprises a first and a second bit cell 20, 21. The first bit cell 20 comprises a first memory transistor having a control terminal, a first and a second terminal and a substrate terminal. Correspondingly, the second bit cell 21 comprises a second memory transistor having a control terminal, a first and a second terminal and a substrate terminal. The first bit cell 20 is configured for non-volatile storage of a first bit and the second bit cell 21 is configured for non-volatile storage of the first bit in inverted form.

The y-decoder arrangement 115 has a first and a second output 111, 112. The sense amplifier arrangement 100 comprises a first and a second input 101, 102. The first output 111 of the y-decoder arrangement 115 is connected to the first input 101 of the sense amplifier arrangement 100. The second output 112 of the y-decoder arrangement 115 is connected to the second input 102 of the sense amplifier arrangement 100.

The first terminal of the first memory transistor is coupled via a first bit line 70 and a first changeover switch 76 of the y-decoder arrangement 115 to the first output 111 of the y-decoder arrangement 115 and thus to the first input 101 of the sense amplifier arrangement 100. Correspondingly, the first terminal of the second memory transistor is coupled via a second bit line 71 and a second changeover switch 77 of the y-decoder arrangement 115 to the second output 112 of the y-decoder arrangement 115 and thus to the second input 102 of the sense amplifier arrangement 100. The memory arrangement 1 comprises an x-decoder 130 that is coupled via a first word line 85 to the control terminal of the first and the second memory transistor.

Correspondingly, the replacement plane 3 comprises a first replacement bit cell 50 and a second replacement bit cell 51. The first replacement bit cell 50 comprises a first replacement transistor having a first terminal coupled via the first bit line 70 and the first changeover switch 76 of the y-decoder arrangement 115 to the first output 111 of the y-decoder arrangement 115. Correspondingly, the second replacement bit cell 51 comprises a second replacement transistor having a first terminal coupled via the second bit line 71 and the second changeover switch 77 to the second output 112 of the y-decoder arrangement 115. The x-decoder 130 is coupled via a first replacement word line 88 to a control terminal of the first and the second replacement transistor.

As can be seen in FIG. 1, the NVM plane 2 comprises further bit cells 30, 40 and the replacement plane 3 comprises at least a further replacement bit cell 60 which are coupled via the first bit line 70 and the first changeover switch 76 of the y-decoder arrangement 115 to the first output 111 of the y-decoder arrangement 100. Additionally, the NVM plane 2 comprises additional bit cells 31, 41 and the replacement plane 3 comprises at least an additional replacement bit cell 61 each having a first terminal coupled via the second bit line 71 and the second changeover switch 77 to the second output 112 of the y-decoder arrangement 115. The further bit cells 30, 31 are coupled via a second word line 86 to the x-decoder 130. Correspondingly, the additional replacement bit cells 60, 61 are coupled via a second replacement word line 89 to the x-decoder 130.

A second terminal of the first memory transistor and of the second memory transistor as well as a second terminal of the first replacement transistor and the second replacement transistor are connected to each other and are connected via a first select transistor 10 to a source select unit 140. The source select unit 140 also comprises an output connected to a control terminal of the first source select transistor 10. The first and the second bit cell 20, 21 and the first and the second replacement bit cell 50, 51 are located in a first well that receives a first well voltage WE1.

Moreover, the NVM plane 2 comprises further bit cells 22 to 25, 32 to 35, 42 to 45, and the replacement plane 3 comprises further replacement bit cells 52 to 55, 62 to 65 which are connected via further bit lines 72 to 75 and further changeover switches 78 to 81 of the y-decoder arrangement 115 to the first and the second output 111, 112 of the y-decoder arrangement 115. The further bit cells and the further replacement bit cells are controlled by the word lines 85 to 87 and the replacement word lines 88 and 89. Moreover, the source select unit 140 is coupled via further select transistors 12, 14 to second terminals of the memory transistors of the further bit cells 22 to 25, 32 to 35, 42 to 45 and of the further replacement bit cells 52 to 55, 62 to 65. The bit cells 30, 31, 40, 41, 60, 61 are located in the first well. The bit cells 22, 23, 32, 33, 42, 43, 52, 53, 62, 63 are embedded in a second well that receives a second well voltage WE2. The bit cells 24, 25, 34, 35, 44, 45, 54, 55, 64, 65 are embedded in a third well that receives a third well voltage WE3.

The y-decoder arrangement 115 comprises a y-decoder switch arrangement 120 and a y-decoder controller 110. The y-decoder switch arrangement 120 comprises the first, the second and the further changeover switches 76-81. The changeover switches 76-81 may be fabricated as high voltage transmission gates. The NVM plane 2 and the replacement plane 3 comprise additional bit cells which are not shown in FIG. 1.

The memory arrangement 1 comprises a data driver 90 having a first output coupled to the first output 111 of the y-decoder arrangement 115 and a second output coupled to the second output 112 of the y-decoder arrangement 115. A signal DL is tapped at the first output and a signal DLB is tapped at the second output of the data driver 90. The memory arrangement 1 comprises a high voltage generator 150 having outputs coupled to the source select unit 140 and the y-decoder controller 110.

Moreover, the memory arrangement 1 comprises a test pad 180 and a test multiplexer 181. The test multiplexer 181 couples the test pad 180 to the high-voltage generator 150, the y-decoder arrangement 115 and the sense amplifier arrangement 100. The test pad 180 is configured for connection to a not shown test equipment in a test phase of the memory arrangement 1. Thus, the test pad 180 has a metallic area appropriated to be contacted for example by a needle of a wafer prober of the test equipment.

The test multiplexer 181 comprises a first switch 182 that is coupled on one side to the first output 111 of the y-decoder arrangement 115 and on the other side to the test pad 180. Correspondingly, a second switch 183 of the test multiplexer 181 is coupled on one side to the second output 112 of the y-decoder arrangement 115 and on the other side to the test pad 180. Moreover, the test multiplexer 181 comprises a reference switch 184 that is coupled on one side to a terminal 103 of the sense amplifier arrangement 100 and on the other side to the test pad 180. Additionally, the test multiplexer 181 comprises a main switch 185 coupling the first and the second switch 182, 183 and the reference switch 184 to the test pad 180. Thus, the first output 111 of the y-decoder arrangement 115 is coupled via a series connection of the first switch 182 and of the main switch 185 to the test pad 180. The second output 112 of the y-decoder arrangement 115 is coupled via a series connection comprising the second switch 183 and the main switch 185 to the test pad 180. The terminal 103 of the sense amplifier arrangement 100 is coupled via a series connection of the reference switch 184 and the main switch 185 to the test pad 180.

The first and the second switch 182, 183, the reference switch 184 and the main switch 185 are realized as transmission gates. Thus, the first switch 182 comprises a p-channel field-effect transistor 220 and an n-channel field-effect transistor 221 having first terminals that are connected to each other and having second terminals that are also connected to each other. Moreover, the first switch 182 comprises an inverter 210 coupling a control terminal of one of the two field-effect transistors 220, 221 to the control terminal of the other of the two field-effect transistors 220, 221. For example, the control terminal of the n-channel field-effect transistor 221 is connected via the inverter 210 to the control terminal of the p-channel field-effect transistor 220. A test control unit 170 of the memory arrangement 1 is connected to a control terminal of the first switch 182, and, thus, to the control terminal of the n-channel field-effect transistor 221. The test control unit 170 provides a first control signal T1 to the first switch 182.

Correspondingly, the second switch 183 comprises a p-channel field-effect transistor 240, an n-channel field-effect transistor 241 and an inverter 230 that are connected such as the corresponding elements of the first switch 182. The test control unit 170 is connected to the second switch 183. The test control unit 170 provides a second control signal T2 to the second switch 183.

Similarly, the reference switch 184 comprises a p-channel field-effect transistor 260, an n-channel field-effect transistor 261 and an inverter 250 that are connected such as the corresponding elements of the first switch 182. The test control unit 170 is connected to the reference switch 184. The test control unit 170 provides a third control signal T3 to the reference switch 184.

Correspondingly, the main switch 183 comprises a p-channel field-effect transistor 280, an n-channel field-effect transistor 281 and an inverter 270 that are connected such as the corresponding elements of the first switch 182. The test control unit 170 is connected to the main switch 185. The test control unit 170 provides a fourth control signal T4 to the main switch 185. The n-channel and the p-channel field-effect transistors 280, 281 of the main switch 185 are realized as high voltage transistors.

Moreover, the test multiplexer 181 comprises a supply switch 186 that couples the test pad 180 to the high voltage generator 150. The supply switch 186 is directly connected on one side to the test pad 180 and on the other side to the high voltage generator 150. The supply switch 186 is configured as a transmission gate. The supply switch 186 comprises a p-channel field-effect transistor 200, an n-channel field-effect transistor 201 and an inverter 190 that are connected such as the corresponding elements of the first switch 182. The test control unit 170 is connected to the supply switch 186. The test control unit 170 provides a fifth control signal T5 to the supply switch 186. The two field-effect transistors 200, 201 may be high voltage transistors.

The memory arrangement 1 comprises a control logic 160 that is connected to the test control unit 170, the high voltage generator 150, the source select unit 140, the y-decoder arrangement 115, the x-decoder 130, the data driver 90 and the sense amplifier arrangement 100. The control logic 160 comprises a memory control logic 161 and a replacement controller 162. The replacement controller 162 may be realized as a byte replacement control logic.

The high voltage generator 150 comprises a charge pump 151 and a changeover switch 152. A first input of the changeover switch 152 is connected to an output of the charge pump 151. A second input of the changeover switch 152 is coupled via the supply switch 186 to the test pad 180. An output of the changeover switch 152 is coupled via a high voltage node 153 to an input of the source select unit 140 and to an input of the y-decoder controller 110. Thus either a supply voltage VPP provided by an external test equipment via the test pad 180 or a high voltage VH generated by the charge pump 151 is provided to the source select unit 140 and to the y-decoder controller 110. During normal operation of the memory arrangement 1, the high voltage VH provided by the charge 151 is used. During a test, the high voltage VH provided by the charge pump 151 or the supply voltage VPP provided via the test pad 180 can be used. The y-decoder controller 110 has an output at which a bias voltage VB is tapped and which is coupled via the changeover switches 76 to 81 to the first terminals of the memory transistors.

A first current I1 flows through the first bit cell 20. The first current I1 flows through the controlled section of the first memory transistor. Thus, the first current I1 flows from the source select unit 140 via the first select transistor 10, the controlled section of the first memory transistor, the first bit line 70, the first changeover switch 76 and the first output 111 of the y-decoder arrangement 115 to the first input 101 of the sense amplifier arrangement 100. Correspondingly, a second cell current I2 flows through the second bit cell 21. The second current I2 flows through the controlled section of the second memory transistor. Thus, the second current I2 flows from the source select unit 140 via the first select transistor 10, the controlled section of the second memory transistor, the second bit line 71, the second changeover switch 77 and the second output 112 of the y-decoder arrangement 115 to the second input 102 of the sense amplifier arrangement 100. The first and the second current I1, I2 flow in case of a word line signal WL1 provided by the x-decoder 130 to the first word line 85 and at a source select signal SL provided by the source select unit 140 to a control terminal of the first select transistor 10.

The sense amplifier arrangement 100 comprises a sense amplifier 104 and a switching unit 105. The sense amplifier 104 can also be realized as a comparator. The first and the second input 101, 102 of the sense amplifier arrangement 100 and the terminal 103 of the sense amplifier arrangement 100 are connected to inputs of the switching unit 105. The switching unit 105 comprises two outputs connected to the two inputs of the sense amplifier 104. The output of the sense amplifier 104 may be coupled to the control logic 160. The switching unit 105 is configured such that two signals of the three signals that are applied to the first and the second input 101, 102 and to the terminal 103 of the sense amplifier arrangement 100 are provided to the two inputs of the sense amplifier 104. Thus, the sense amplifier arrangement 104 is configured to compare either the signal at the first input 101 with the signal at the second input 102 or the signal at the first input 101 with the signal at the terminal 103 or the signal at the second input 102 with the signal at the terminal 103.

The three signals at the two inputs 101, 102 and at the terminal 103 of the sense amplifier arrangement 100 may be implemented as current signals. For example the signal at the first input 101 may be the first current I1 provided by the first bit cell 20. The signal at the second input 102 may be, for example, the second current I2 generated by the second bit cell 21. The not shown test equipment provides a reference current IREF via the test pad 180, the main switch 185 and the reference switch 184 to the terminal 103 of the sense amplifier arrangement 100. The sense amplifier 104 may be implemented as an amplifier having currents as input signals. The sense amplifier 104 may be designed as a current comparator. The sense amplifier arrangement 100 provides an output signal SOUT.

In FIG. 1, a test concept for an endurance screening is shown. To enable an efficient screening algorithm in terms of sensitivity, area and test time, the memory arrangement 1 features special test modes. The program and erase state of the NVM plane 2 based on Fowler-Nordheim tunneling can be measured in two ways. A threshold voltage UTH or a drain source current ICELL can be used to judge, if a bit cell 20, 21 is good programmed or good erased. To make things easier for the description of the patent application, the drain source current ICELL will be used to describe the screening algorithm. The drain source current ICELL may be called bit cell current. The drain source current ICELL may be e.g. the first or the second current I1, I2. For other technologies other useful screening parameters can be found and used for the described screening method.

The memory arrangement 1 features a test mode which is capable of measuring the bit cell current ICELL of each individual bit cell 20-65 of the non-volatile memory plane 2. The non-volatile memory plane 2 shown in FIG. 1 is fully differential. That means a pair of bit cells e.g. the bit cells 20, 21 are forming 1 data bit of the NVM plane 2. To realize a logic '1', the first bit cell 20 is programmed and the second bit cell 21 is erased. To store a logic '0', the first bit cell 20 is erased and the second bit cell 21 is programmed. A fully differential memory area already includes redundancy in the memory arrangement 1 and the readout margin of the sense amplifier arrangement 100 is optimal.

As described in the block diagram of FIG. 1, special switches, namely changeover switches 76-81, are used in the signal path from the bit cells 20 to 65 to the sense amplifier arrangement 100. The test control unit 170 sets the first or the second switch 182, 183 (depending which bit cell should be connected to the test pad 180) and the main switch 185 in a conducting state. The test control unit 170 can be named test control logic. The inputs 101, 102 of the sense amplifier arrangement 100 are switched to high impedance by the control logic 160 and the selected bit cell 20, 21 defined by the address-bus of the memory arrangement 1 is connected to the test pad 180. Depending on the used technology, the first bit cell current I1 or the second bit cell current I2 can be measured in this applied test mode. For technologies based on PMOS bit cells the drain source current I1, I2 of the selected bit cell 20, 21 can be measured against ground. NMOS based bit cell currents I1, I2 are measured against the positive supply.

The actual applied address forced via the x-decoder 130 and y-decoder arrangement 115 to the NVM plane 2 defines the byte which is measured. A special test mode is needed to select the wanted bit or bit cell which is measured on the test pad 180. To measure all 8 bits of the selected byte, 8 test modes may be implemented. With an additional test mode it is possible to switch between the left bit cell 20 and the right bit cell 21 of the data bit. If the test control unit 170 generates the first control signal T1, also called TM_ICELL, switching from "low" to "high", the first switch 182 is set in a conducting state. If the test control unit 170 generates the third control signal T3, also called TM_I_MEAS, switching from "low" to "high", the main switch 185 is set in a conducting state. Thus, the left bit cell is connected via the first switch 182 and the main switch 185 to the test pad 180 and provides the bit cell current ICELL to the test pad 180. Therefore, the first bit cell 20 may be connected via the first switch 182 and the main switch 185 to the test pad 180 and may provide the first current I1 to the test pad 180.

When the first control signal T1 is set to "low" and the second control signal T2, also called TM_ICELLB, is set to "high" and the main switch 185 stays in a conducting state, the right bit cell is connected to the test pad 180 and provides a bit cell current ICELLB to the test pad 180. Thus, the second bit cell 21 may be connected to the test pad 180 via the second switch 183 and the main switch 185 and may provide the second current I2 to the test pad 180. This test approach features exactly what is needed to measure a bit cell current distribution from the NVM plane 2.

This measurement concept may possibly increase the test time as the memory size increases. Each measurement needs a defined setup time to measure the current ICELL, ICELLB flowing through the test pad 180 to the not shown production test equipment either to ground or positive supply. The needed setup time is limited by the test equipment. To overcome that problem a test mode using an external reference current IREF is implemented. The external reference current IREF is forced through the test pad 180 by closing the main switch 185 and the reference switch 184 (the third control signal T3 and the fourth control signal T4, also called TM_FORCEIREF, are set to "high", the first and the second control signals T1, T2 and the fifth control signal T5, also called TM_VPP_EXT, are set to "low" and distributed to the sense amplifier arrangement 100).

Depending on the used memory concept (fully differential, pseudo differential or single ended) the external reference current IREF is used to measure the value of the selected bit cell current I1, I2. This is done by sweeping the external reference current IREF. The sweep direction and step size depends on the chosen technology. The advantage using this method is that all bits or bit cells of the selected address can be tested at the same time. The output is the standard digital output signal SOUT of the memory arrangement 1. Each applied bit cell current I1, I2 can be tested with the standard read access time. With the applied external current IREF the whole address range can be checked. This enables fast testing because the time consuming setup of the external reference current IREF is only needed once for each current step before the whole address range is checked with this reference level.

It is an advantage for a successful screening that all tested bit cells are treated the same way especially during program and erase. Thus, full control over the program and erase voltage and the program and erase timing is provided by the memory arrangement 1. Most of the modern NVMs have the internal high voltage generator 150 providing the needed high voltage VH during program and erase. As this high voltage generator 150 is based on an internal reference like a bandgap voltage generator, a variation of the high voltage VH provided by the high voltage generator 150 may be generated due to process and mismatch. The same is true for an internal oscillator. This variations make it difficult to setup a sensitive endurance screening procedure. Therefore, it is advantageous to have access to the internal high voltage node 153 of the NVM arrangement 1 in a special test mode to have full control on the high voltage level and timing. By closing the supply switch 186 and the main switch 185 (the third and the fifth control signals T3, T5 are set to "high", and the first, second and fourth control signals T1, T2, T4 are driven to "low" from the test control unit 170), the internal high voltage node 153 is connected to the test pad 180. Now the production test equipment can generate the needed supply voltage VPP and timing during program and erase by forcing the needed signals to the test pad 180. This ensures that all bit cells 20-65 receive exactly the same program and erase pulse and therefore enabling the needed precision for the high endurance screening.

Two options exists: the value of the supply voltage VPP during program and erase is fixed and the timing is varied or the timing is fixed and the value of the supply voltage VPP is varied. Both approaches are leading to similar results. The following explanation of the screening algorithm is based on varying the supply voltage VPP during program and erase. But the algorithm also works for varying the timing during program and erase.

FIG. 2 shows a further exemplary embodiment of the memory arrangement 1 that is a further development of the embodiment shown in FIG. 1. The memory arrangement 1 comprises a counter arrangement 300. The counter arrangement 300 can be realized as a NVM counter. The counter arrangement 300 is coupled to the control logic 160. Thus, the counter arrangement 300 is coupled to the memory control logic 161 and to the replacement controller 162. Moreover, the counter arrangement 300 is coupled to the high voltage generator 150 and to the test control unit 170. The counter arrangement 300 comprises several counters 310 to 312.

Moreover, the memory arrangement 1 comprises an address buffer 301, an address select block 302 and an address decoder 303. The address buffer 301 is coupled to the address decoder 303 by the address select block 302. The address decoder 303 is coupled on its output side to the x-decoder 130 and to the y-decoder controller 110. The address buffer 301 is coupled to the memory control logic 161 and to the replacement controller 162. The memory control logic 161 is coupled via an interface 304 of the memory arrangement 1 to a bus 305. The bus 305 comprises a control bus having a bus signal CONTROL_BUS, a TM bus having a bus signal TM_BUS and an address bus having a bus signal ADDR_BUS. The TM bus may be implemented as a telemetry bus.

A column latch 306 of the memory arrangement 1 is coupled to the memory control logic 161, the high voltage generator 150 and the bit cell plane 2. In addition, the memory arrangement 1 comprises an address replacement plane 307. The address replacement plane 307 may be called address replacement array. The address replacement plane 307 is connected to the replacement plane 3 and to the y-decoder arrangement 115. The test control unit 170 is connected to the terminal 103 of the sense amplifier arrangement 100 and to the y-decoder arrangement 115 via the test multiplexer 181 that is not shown in FIG. 2. The test control unit 170 has a terminal at which a test control signal MEAS can be tapped. The memory arrangement 1 comprises an input/output buffer 308 that couples the sense amplifier arrangement 100 to a data bus and provides an input/output data signal DATA I/O. The input/output data signal DATA I/O is a function of the output signal SOUT.

In the test phase, the test equipment determines which bit cell 20 to 25, 30 to 35, 40 to 45 fails a criteria of the test and, thus, is a preselected bit cell. Additionally, the test equipment determines which replacement bit cell 50 to 55, 60 to 65 is used for replacement of the preselected bit. The test equipment stores this information in the address replacement plane 307.

A dynamic byte replacement concept can be performed by the memory arrangement 1 shown in FIG. 2. The weak bit cells are screened during production test. The memory arrangement 1 is configured to safely replace the weak bit cells in the field. After each power-up the memory arrangement 1 knows which bit cells have to be replaced by which bytes in the replacement plane 3 of the memory arrangement 1. Therefore, additional information is stored in the memory plane. In FIG. 2, the block diagram of a possible byte replacement NVM arrangement 1 is shown. The memory arrangement comprises building blocks of an NVM like the high voltage generator 150, the memory control logic 161, the address buffer 301, the address decoder 303, the column latch 306, the source select unit 140, the test control unit 170, the x-decoder 130, the non-volatile memory plane 2, the y-decoder switch arrangement 120 realized by high voltage transmission gates, the sense amplifier arrangement 100, the input/output buffer 308 and the y-decoder controller 110.

Additionally, the following building blocks are used for the bit replacement: The replacement plane 3 where the replacement bit cells 50 to 55, 60 to 65 are located and the address replacement plane 307. The replacement plane 3 can be implemented as byte replacement plane. In the address replacement plane 307, the information is stored which address is replaced by which replacement byte, the cycle class of the weak bit cell if a dynamic replacement strategy is used, a status bit of if the address replacement information is used or not and a possible cyclic redundancy code, abbreviated CRC, to secure the information. The address replacement plane 307 need no endurance performance at all because the information in that section is only written once at production test. So only data retention is of interest for this part of the memory arrangement 1 and, therefore, a simple CRC or ECC can be implemented to ensure the data does not change during life time.

For the dynamic replacement strategy, the counter arrangement 300 counts the number of write cycle executed on the memory arrangement 1. Also the address select block 302 changes dynamically the x-address for the dynamic replacement approach. During production test the weak bit cells are safely screened with the screening algorithm described in the patent application. The test equipment stores during the screening all weak bit cell locations of the non-volatile memory plane 2 in the address replacement plane 307 together with the replacement bit cells of the replacement plane 3 and the cycle class of each failure.

The memory arrangement 1 is realized as an electrically erasable programmable read-only memory, abbreviated EEPROM. The counter arrangement 300 is implemented as a NVM counter. For example, for a 1k×8 EEPROM statistically maximum 5 bit cells may be replaced to achieve 1M write cycles. 1 million is shorted 1M. For a dynamic replacement strategy, the NVM counter 300 may be needed operating up to 1M counts. 20 bits are needed for a 1M counter. 12 LSB bits are secured with a (23,12) Goley-Code, whereas this code can correct 3 failures and detect 4 failures. 8 MSB are not secured because the number of write cycles are very low. Thus, the counter arrangement 300 having five counters 310 to 312 may fulfill the requirement for the dynamic replacement approach. During production test each counter 310 to 312 is assigned to a weak bit cell. Every time this bit cell is selected and written, the value of the counter 310 to 312 is increased. If the maximum number of cycles of the weak bit cell is reached, the replacement byte is activated. The high voltage generator 150 can be shared with the main memory.

The replacement plane 3 may be named dynamic replacement memory. For example, the memory arrangement 1 comprises eight additional word lines 88, 89 for the replacement bytes and address replacement information. The NVM counter arrangement 300 is used to switch between weak bit cells and replacement bit cells. The x-decoder 130 comprises one additional hidden x-address bit needed to access the replacement plane 2 or the address replacement plane 307.

For example, five replacement bytes and address information memory are needed. Only one charge pump 151 for memory and NVM counter may be sufficient. Advantageously, no additional column latches, y-decoder and sense amplifier are needed. In an example, 1M write operation may be achieved.

To summarize, an area of the memory arrangement 1 with dynamic replacement is increased compared to standard NVM by about 27%. An area of a memory arrangement having a (12,8) Hamming ECC is increased compared to standard NVM by about 36%. Thus, the dynamic byte replacement memory is smaller compared the (12,8) Hamming ECC approach. The dynamic byte replacement memory may enable e.g. a true 1M write operation NVM. A read access time of the byte replacement memory is shorter because no ECC processing is needed.

Figure 3:
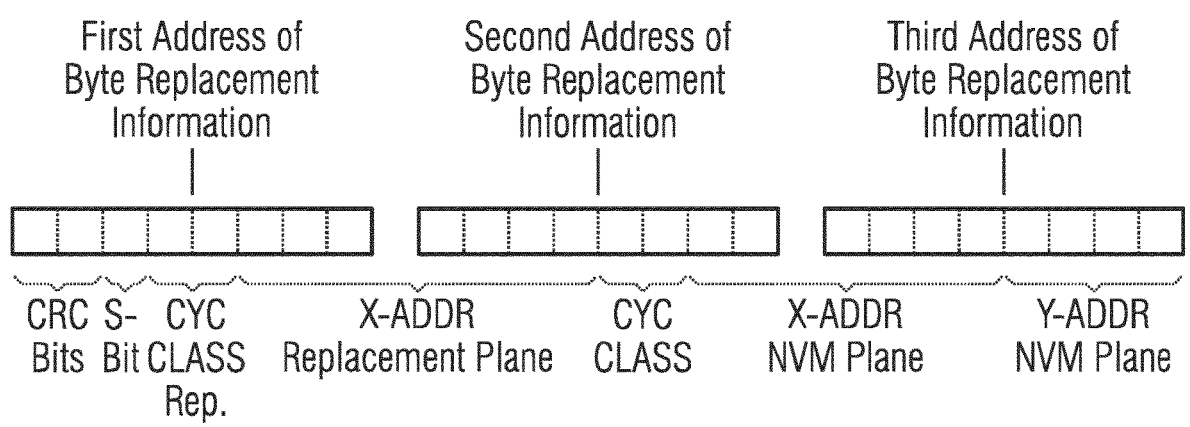
FIG. 3 shows an exemplary embodiment of information stored in a memory arrangement.

FIG. 3 shows an embodiment of information stored in the memory arrangement 1 shown in FIGS. 1 and 2. The following information is stored in the address replacement plane 307: The address that is needed to replace a byte in the NVM plane 2 by a byte in the replacement plane 3. The information comprises a first, second and third address of byte replacement information.

Thus, the information stored in the address replacement plane 307 comprises the x-address of the replacement byte in the replacement plane 3, the x-address of the preselected byte in the NVM plane 2 and the y-address of the preselected byte in the NVM plane 2. Since the y-address of the preselected byte which is comprised by the NVM plane 2 and has to be replaced is the same as the y-address of the replacement byte in the replacement plane 3, only one y-address is included in the information. Moreover, the information stored in the address replacement plane 307 comprises an information about the cycle class of the byte of the NVM plane 2 and may also comprise an information about the cycle class of the replacement byte of the replacement plane 3. Additionally, the information comprises cyclic redundancy check bits, abbreviated CRC bits. Moreover, the information may comprise a status bit, called S-bit.

In FIG. 3, a possible implementation of information is shown configured to replace a byte in the NVM memory plane 2 with a byte located in the replacement plane 3. The information is stored in address replacement plane 307. How many bytes are needed to store the correct information depends on the size of the memory (x- and y-address), the implemented cycle classes and the used type of CRC. The y- and x-address (x-address NVM plane 2, y-address NVM plane 2) of the preselected byte which has to be replaced is stored followed by the cycle class bits CYC CLASS defining how many endurance cycles the preselected and to be replaced byte is able to survive. In the presented example, four cycle classes are used that means two bits are suited to identify the correct cycle class. Next the x-address (x-address replacement plane 3) of the replacement byte in the replacement plane 3 is defined. Therefore, the replacement plane 3 can be named byte replacement plane.

The y-address is not needed because the replacement byte is located in the same memory well and, therefore, has the same y-address than the preselected byte. If the dynamic replacement strategy is used, the cycles class CYC CLASS Rep. of the replacement byte in the replacement plane 3 is also useful. To identify if the address information is used or cannot full fill the needed data retention requirement, the status bit S-Bit is implemented. If the status bit is "high", all address information bytes are correct and the address replacement information must be used to replace a weak bit cell. If the status bit is zero either the address information is not needed or defect. In addition a CRC can be used to identify, if the information in the address replacement bytes are correct.

To replace a weak bit cell in the NVM plane 2, the following procedure is executed. The locations of the weak bit cell, also called preselected bits, are known from the screening algorithm. Depending on the fixed y-address from the failure the correct x-address in the replacement plane 3 must be defined. Regarding to the first failure B1 in the example shown in FIG. 4, the first replacement word line 88 in the replacement plane 3 is used. This defines now the x- and y-address in the replacement plane 3. Before the replacement address can be fixed, it is checked if the byte in the replacement plane 3 is capable of surviving the specified number of endurance cycles. If the byte is cable of providing the endurance cycle the address is fixed. Next is to check if the address information byte can full fill the data retention. If yes the needed information is stored in the address replacement plane 307 which can also be named address information plane by writing the three bytes as shown in the example of FIG. 3 with the defined information.

If the address replacement bytes are not able to full fill the data retention specification, the status bit S-Bit of the first address information is set to "low" and the memory arrangement 1 tries to write the information to the second address replacement location if this location is safe. Once a valid address location is found, the status bit S-Bit is set to "high" indicating that a byte has to be replaced in the NV memory plane 2 and that the information is safe. If the first replacement word line 88 is not capable of providing the needed endurance cycles, the memory arrangement 1 simply switches to the second replacement word line 89 and check if this location is appropriate. This procedure is done as long as a valid location is found. If the memory arrangement 1 runs out of word lines, the memory arrangement 1 is marked as fail and the part is screened out. The same procedure is done for failure B2, B3 and B4. At the end of the algorithm for each failure the location of the byte replacement is defined and stored in the address replacement plane 307.

To ensure that the memory arrangement 1 automatically replace the preselected bit cells (that means the weak bit cells) in the application the replacement controller 162 is used. After each power-up the address replacement plane 307 is loaded into a shadow register which is part of the replacement controller 162. The size of the shadow register equals the number of bytes in the address replacement plane 3. Depending on the status bit S-bit the address remapping is activated or not. For each active address replacement the CRC is checked. If a fail is detected an error flag is set to indicate that the NVM plane 2 has a malfunction. At each standard access of the NVM plane 2 the address bits are split into x- and y-address by the memory decoders 110, 130. The replacement controller 162 checks now if the actual address matches with an address which must be replaced. If a match is found the address is automatically rerouted to the correct replacement byte in the replacement plane 3. The needed additional logic for the address comparison depends on the size of the memory. As the x-decoder 130 normally is full decoded the replacement plane 3 and the address replacement plane 307 needs an additional x-address bit as seen in FIG. 3. This additional bit cannot be accessed from outside which gives an excellent security not to destroy the information in this two replacement planes 3, 307 by an unwanted write access from outside.

For bigger memory sizes more failures will occur which are replaced safely which may lead to an additional area overhead. Regarding failure B4 of the example presented in FIG. 4, the weak bit cell can provide 750 k endurance cycles. To replace such a byte at 0 hours during production screening seems to very inefficient. If the number of already written endurance cycles is known a dynamic replacement strategy can be implemented. Therefore, the NVM counter arrangement 300 is used in the memory arrangement 1. At each write cycle one of the counters 310-312 of the counter arrangement 300 is automatically incremented. By knowing the exact number of write cycles and the cycle classes of the weak byte and the replacement byte it is possible to switch dynamically during lifetime from the weak byte location to the replacement location. Only the sum of both bytes has to full fill the maximum number of specified endurance cycles. In case of B4 the byte in the NVM memory plane 2 is capable of providing 750 k endurance cycle, the replacement byte in the replacement byte plane 3 only needs to provide 250 k endurance cycles. This leads to a relaxed specification for the endurance performance of the replacement bytes and safes area especially for bigger memory sizes. To enable that feature the replacement controller 170 checks the actual value of the NVM counter and compare that value with the cycle class information of the weak bit cells stored in the address replacement plane 307. If the NVM counter value is higher than the cycle class the address select block 302 switches automatically to the replacement byte.

The NVM counter arrangement 300 can be implemented in different ways. One possibility is that the counter arrangement 300 is part of the non-volatile memory plane 2 with the drawback of the need of write operation to increment the counter value. First write operation is needed to execute the standard write operation, second write is needed to increase the counter value. Second approach is to have the NVM counter arrangement 300 separated from the NVM plane 2 using the same write operation as a standard write access to increment one of the counters 310-312. In both cases special counters 310-312 are implemented using special ECC to simply avoid that the bit cells in the counters 310-312 will fail. To enable a correct dynamic replacement the counter value should be always correct.

Figure 4:
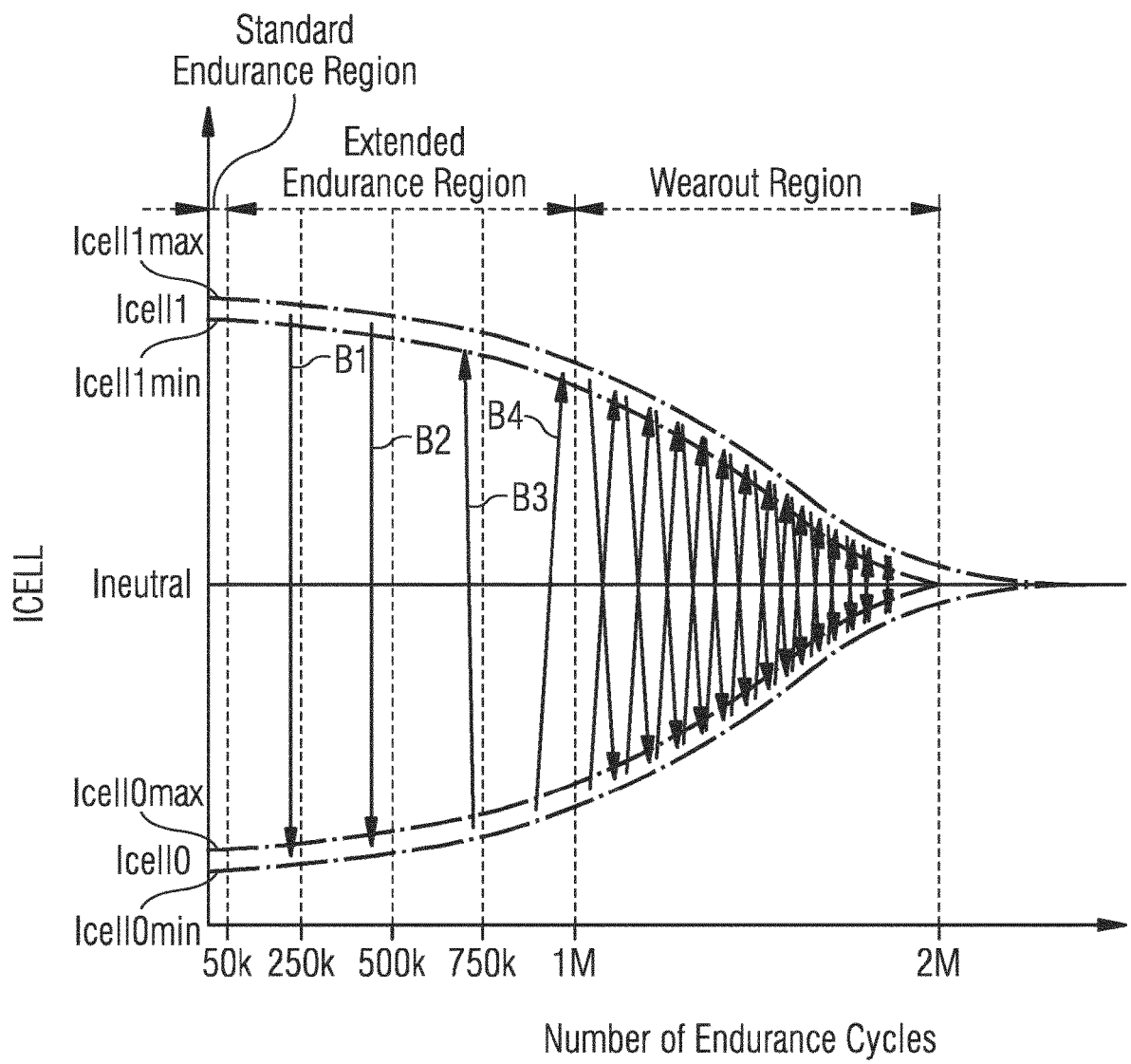
FIG. 4 shows a characteristic of a non-volatile bit cell.

FIG. 4 shows a characteristic of NVM cells, such as bit cells 20 to 65 of the NVM plane 2. In FIG. 4, the endurance behavior of an NVM plane 2 based on Fowler-Nordheim tunneling is explained. The number of endurance cycles cannot be predicted precisely. To enable a screening procedure which is capable to screen weak bit cells up to 500 k endurance cycles and more this is mandatory. A closer look to the endurance behavior of NVMs based on Fowler-Nordheim tunneling in FIG. 4 shows that after a correct infant mortality screening only a few bit cells inside the NVM plane 2 have a potential risk to fail before the NVM plane 2 reaches the wear out region. To extend the number of endurance cycles close to the wear out region, bit cells must be identified and screened out or replaced by bit cells which are capable to withstand a high number of endurance cycles.

Figure 5:
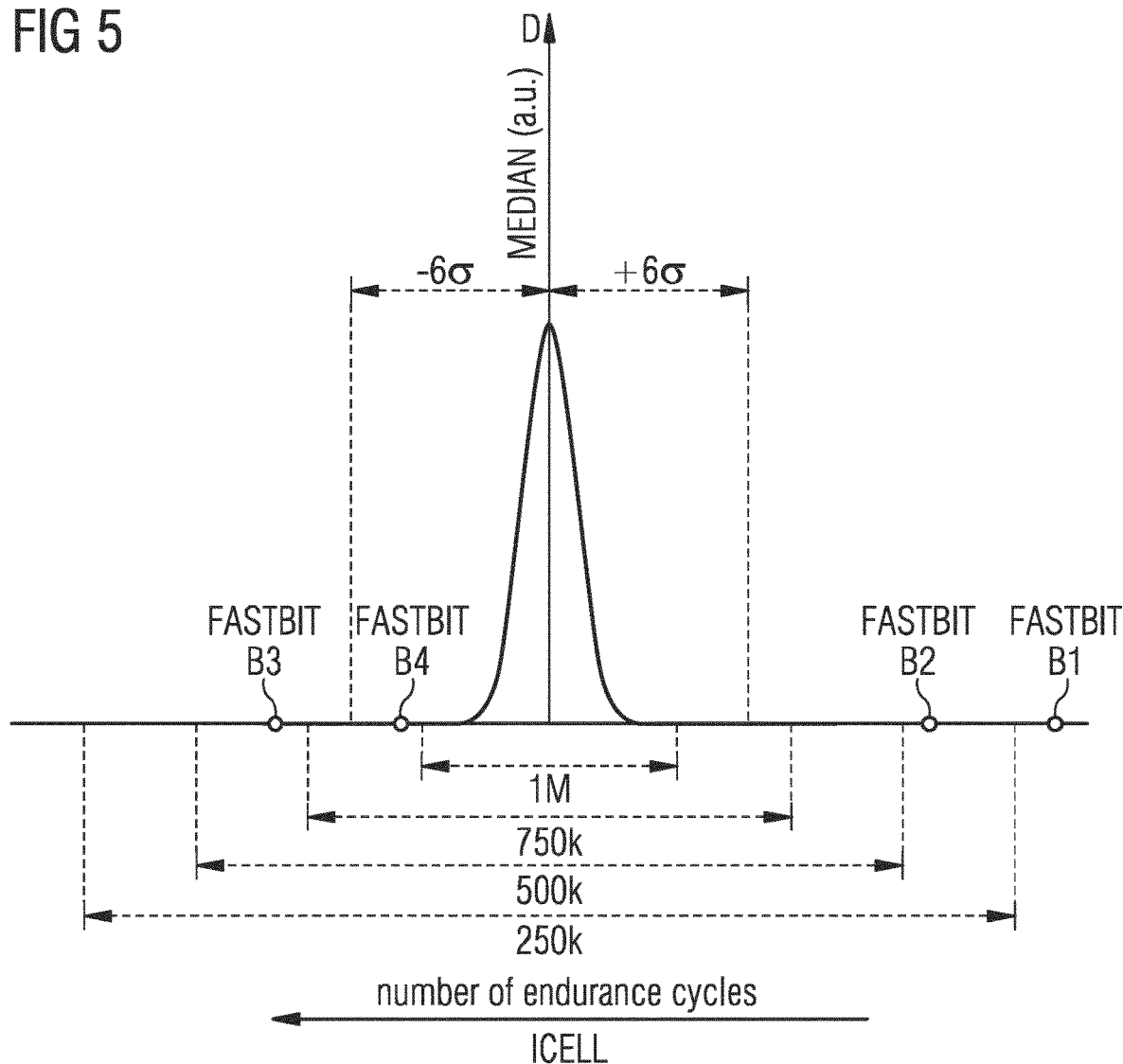
FIG. 5 shows an exemplary embodiment of cycle classes.

Depending on the used bit cell technology it is possible to measure the erase and programming state of a NVM bit cell 20 either by the threshold voltage UTH of the bit cell 20 or looking to the drain source current I1 of the bit cell 20. A programmed bit cell 20 delivers a drain source current Icell1 in the range of Icell1 max and Icell1 min and an erased bit cell a current Icell0 between Icell0max and Icell0min, as shown in FIG. 4. As the bit cells are produced in an area efficient manner and the size of the bit cell is the main area contributor, the size of the bit cells is pushed to the process limits. Therefore, a bit cell current distribution D of the bit current ICELL for program and erase across the memory plane, wafer and lot exists. An example for such a distribution D is shown in FIG. 5. This fact makes it tough to setup a precise screening method based on fixed values due to the variation of the bit cell current.

From FIG. 4 it can be seen that 50 k endurance cycles can be safely screened and secured with standard screening procedures achieving an acceptable yield loss and test time. To extend the number of endurance cycles to screen for 1M endurance cycles, the algorithm is capable to find all weak bit cells in the extended endurance range shown in FIG. 4. Such weak bit cells have no hard failure mechanism like short to ground or supply, the failure modes can be charge traps in the tunnel oxide or interpoly oxide caused by contamination or pin holes which are activated during lifetime. The failures close to the maximum allowed number of endurance cycles in the extended endurance range are the most difficult to find. As discussed earlier the program and erase bit cells are having bit cell current distributions caused by mismatch and process variation. To push out safely the maximum number of endurance cycles the screening procedure is able to catch all infant mortality and weak bit cells in the extended endurance range.

The present patent application shows an algorithm which is sensitive enough to screen safely such weak bit cells. As FIG. 4 is showing a weak bit cell after its failure is activated it can lead to a stuck at high or stuck at low. That means depending on the technology and failure mode a fast erase bit cell is not necessarily a fast programming bit cell or vice versus. So it is essential to prove and screen both program and erase states. As the screening procedure is capable of finding the exact location of the weak bit cells in the NVM plane 2, a byte replacement is shown which leads to a yield improvement. With this replacement strategy it is possible to achieve a yield close to the yield of a standard screening procedure screening for a lower number of endurance cycles. The area penalty is small compared to an ECC approach. The replacement bytes in the replacement plane 3 is also screened with the algorithm to ensure that the replacement bytes are capable of achieving the maximum number of endurance cycles.

In addition by adding digital functionality, the replacement strategy can be dynamic. For instance the memory arrangement 1 is designed to replace a bit cell which is capable of 750 k endurance cycles but not 1M. 1 million is shorted 1M. It is not efficient to replace such a bit cell at the screening stage as the screening algorithm knows when the bit cell will fail. Thus, the memory arrangement 1 uses the NVM write counter arrangement 300 in the memory arrangement 1 which counts the number of write cycles executed on the NVM plane 2. The memory arrangement 1 can then safely switch after 500 k endurance cycles to the replacement byte instead of 0 write cycles. This relaxes the needed endurance cycle of the replacement bytes and is more efficient because less replacement bytes are need which gives an additional area benefit for high density memories.

To implement an efficient screening method which enables a byte replacement strategy, it is determined when the NVM bit cell will fail caused by endurance cycling. Therefore, so called cycle classes can be defined which will give a prediction on how many endurance cycles a NVM bit cell can withstand. As stated above, NVMs with standard screening procedures are capable of 50 k endurance cycles at 150° C. To extend this number of write cycles for example to 1M, four cycle classes 250 k, 500 k, 750 k and 1M are defined. As shown in FIG. 4 most of the NVM bit cells of the state of the art NVM process can handle the 1M write cycles. Only a few bit cells are not able to achieve this high number. These bit cells are of interest. Depending on the defect those bit cells can delivery in the range of 50 k to 1M endurance cycles. In FIG. 4 four examples are shown, failure B1 is activated close to 250 k endurance cycles and produces a stuck at "low". B2 shows the same failure mode and is activated in the range of 500 k endurance cycles. B3 generates a stuck at "high" failure close to 750 k endurance cycles and B4 shows the same failure near 1M. All four failures must be safely detected by the screening procedure to enable a correct replacement of the weak bit cells so the memory arrangement 1 may full fill e.g. 1M write cycles.

The generation of cycle class statistics of the endurance performance results in a better understanding of the failure modes of the technology and how they are activated. Generating such statistics is a huge effort because endurance cycling of NVMs is very time consuming.

FIG. 5 shows an exemplary embodiment of cycle classes. The cycle classes may be named endurance cycle classes. The endurance behavior of the bit cells follows a Gaussian distribution as shown in FIG. 5. In FIG. 5, a distribution D is shown as a function of the bit cell current ICELL. Most of the bit cells of a well settled NVM process are able to withstand a high number of endurance cycles depending on the used technology; the value is varying. Hot carrier charge injection technologies will not achieve the high numbers of Fowler-Nordheim tunneling technologies. But the presented screening algorithm also works for hot carrier and sidewall spacer technologies and can extend the endurance cycles for such types of technologies as well.

As shown in FIG. 5, the probability to survive a high number or endurance cycles of a settled NVM technologies is high. The exact numbers and sigma values strongly depends on the technology and the defect density from the production line. After a successful infant mortality screening the likelihood of failure B1 (<250 k endurance cycles) is very low. As the number of endurance cycles are increasing the likelihood rises to get a fail (B2, B3 and B4). The maximum number of endurance cycles and the cycle classes of a NVM technology can be calculated using the Gaussian distribution and the given sigma value.

The number of cycle classes depends on the sensitivity of the screening algorithm and the chosen replacement strategy. To keep the area overhead small for implementing the replacement strategy, the number of cycle classes should be kept low. The number of cycle classes may be e.g. two, three, four and so on.

Figure 6:
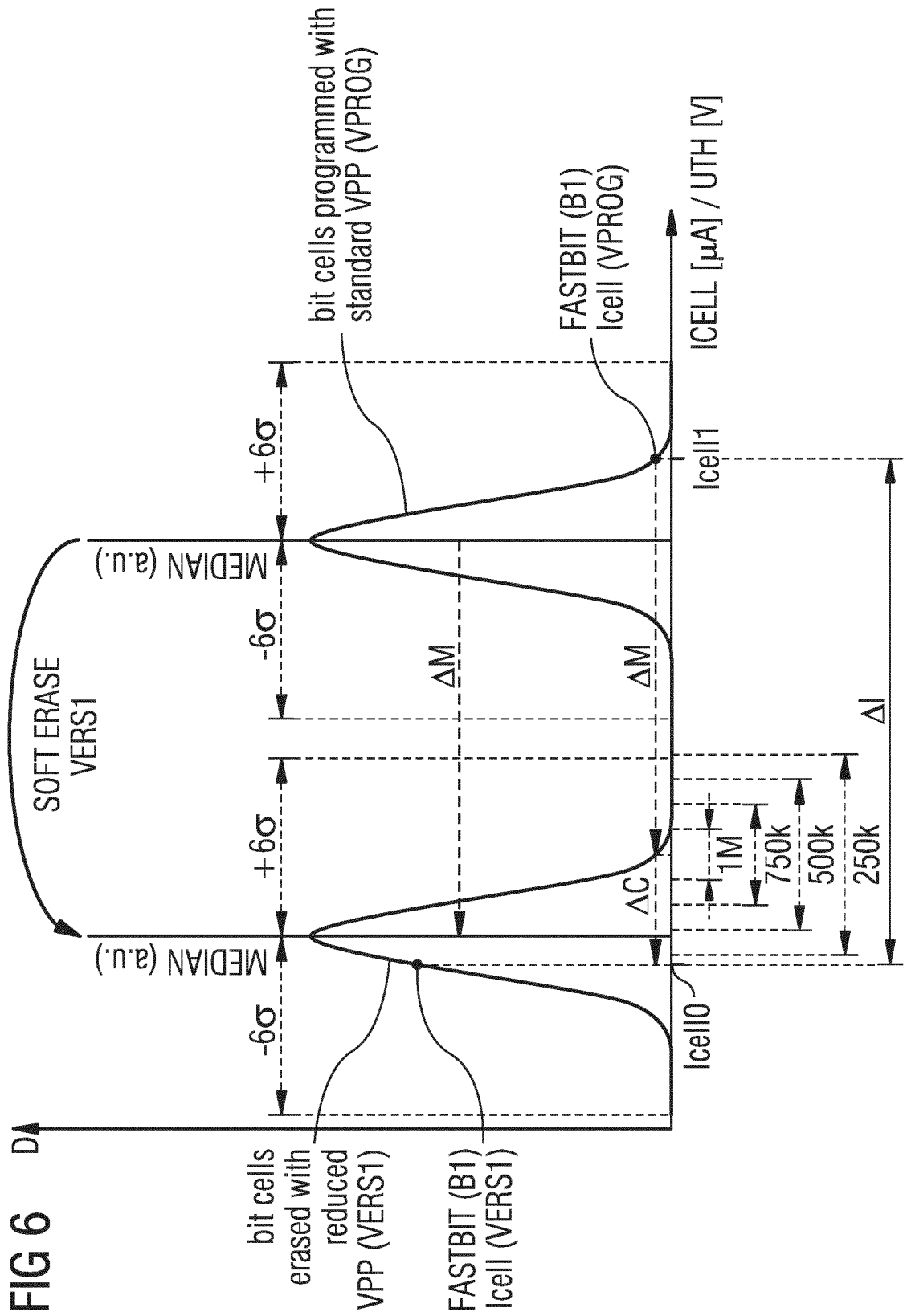
Figure 7:
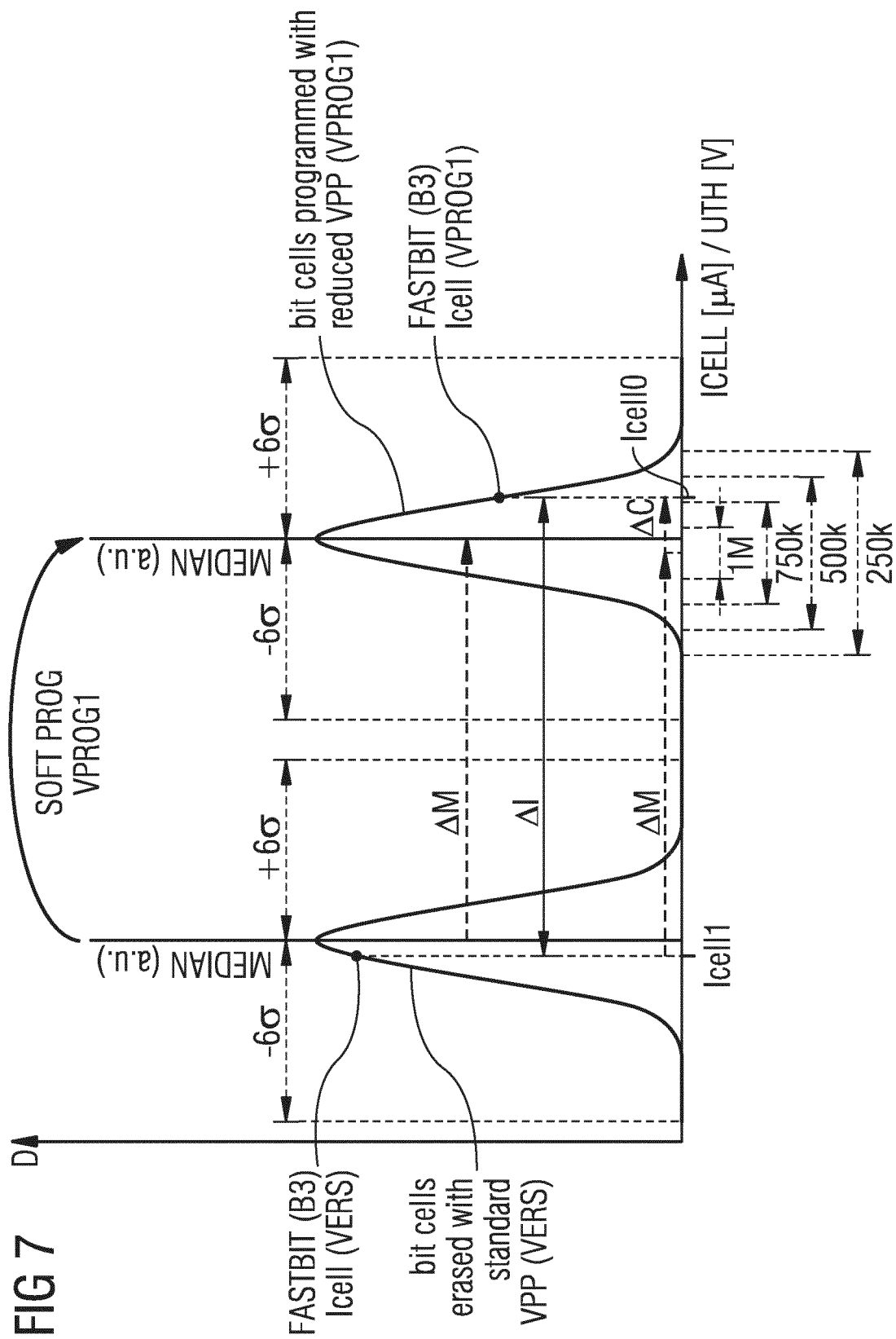

FIGS. 6 to 11 show exemplary embodiments of methods for testing the memory arrangement 1 shown in FIGS. 1 and 2. In FIG. 6, a soft erase screening based on one soft erase pulse is shown. In FIG. 7, a soft program screening based on one soft program pulse is explained. In FIGS. 6 and 7, the distribution D of the bit cells of the non-volatile memory plane 2 is shown as a function of the bit cell current ICELL of said bit cells for two different states. The bit cell current ICELL of one bit cell is measured twice, namely in the erase state and in the program state. Instead of the bit cell current ICELL, a threshold voltage UTH of the bit cells of the non-volatile memory plane 2 could be measured.

Figure 8:
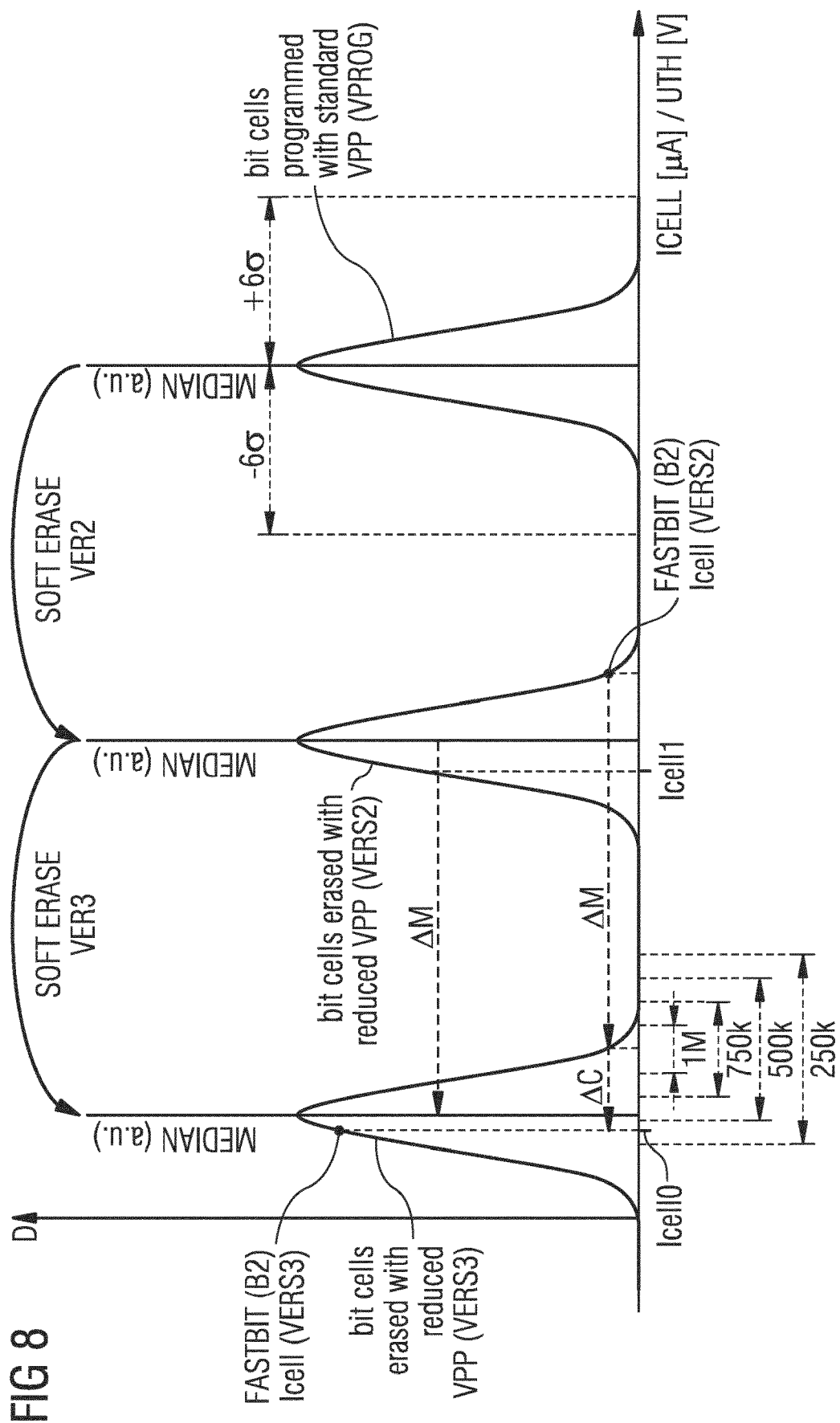
Figure 9:
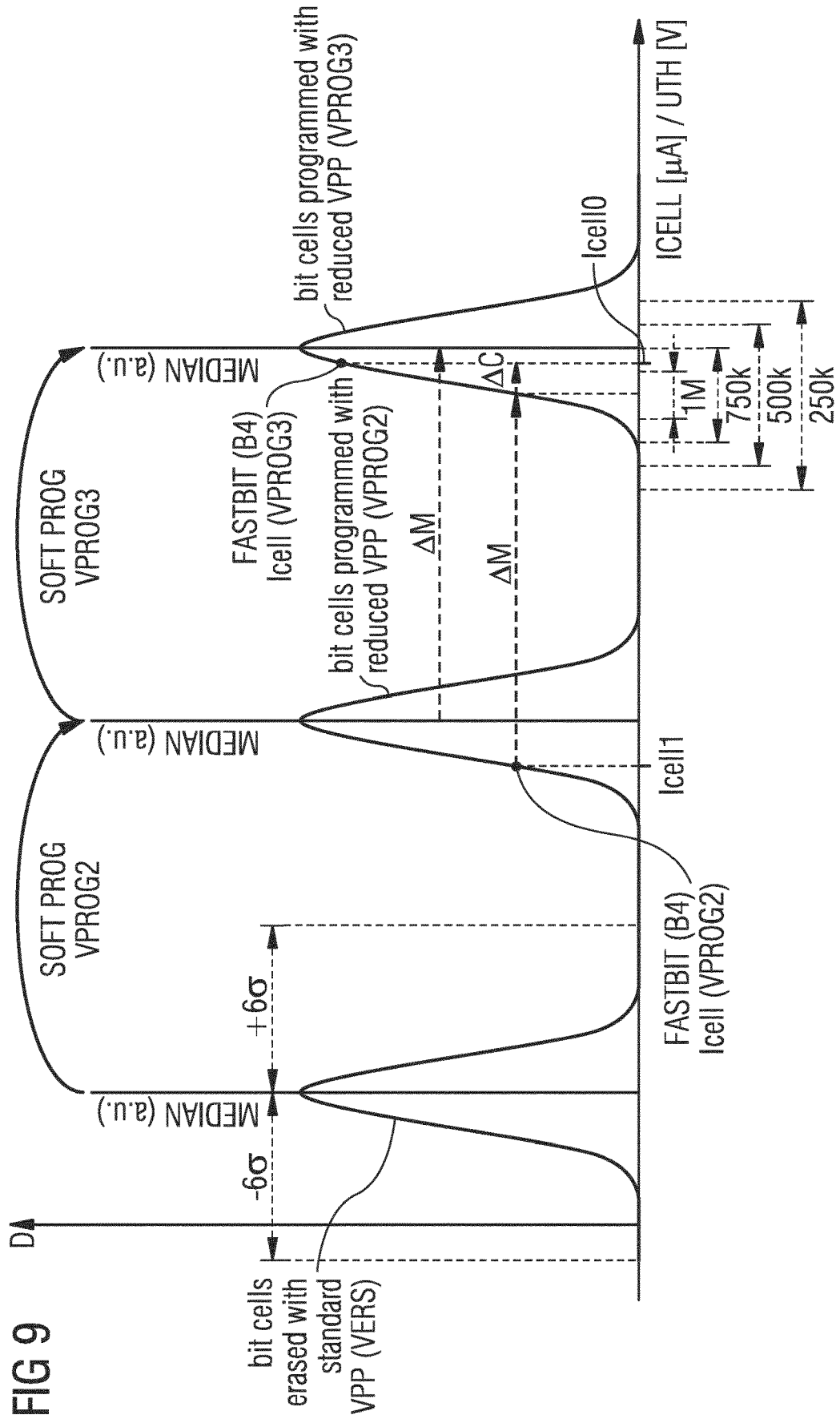
Figure 10:
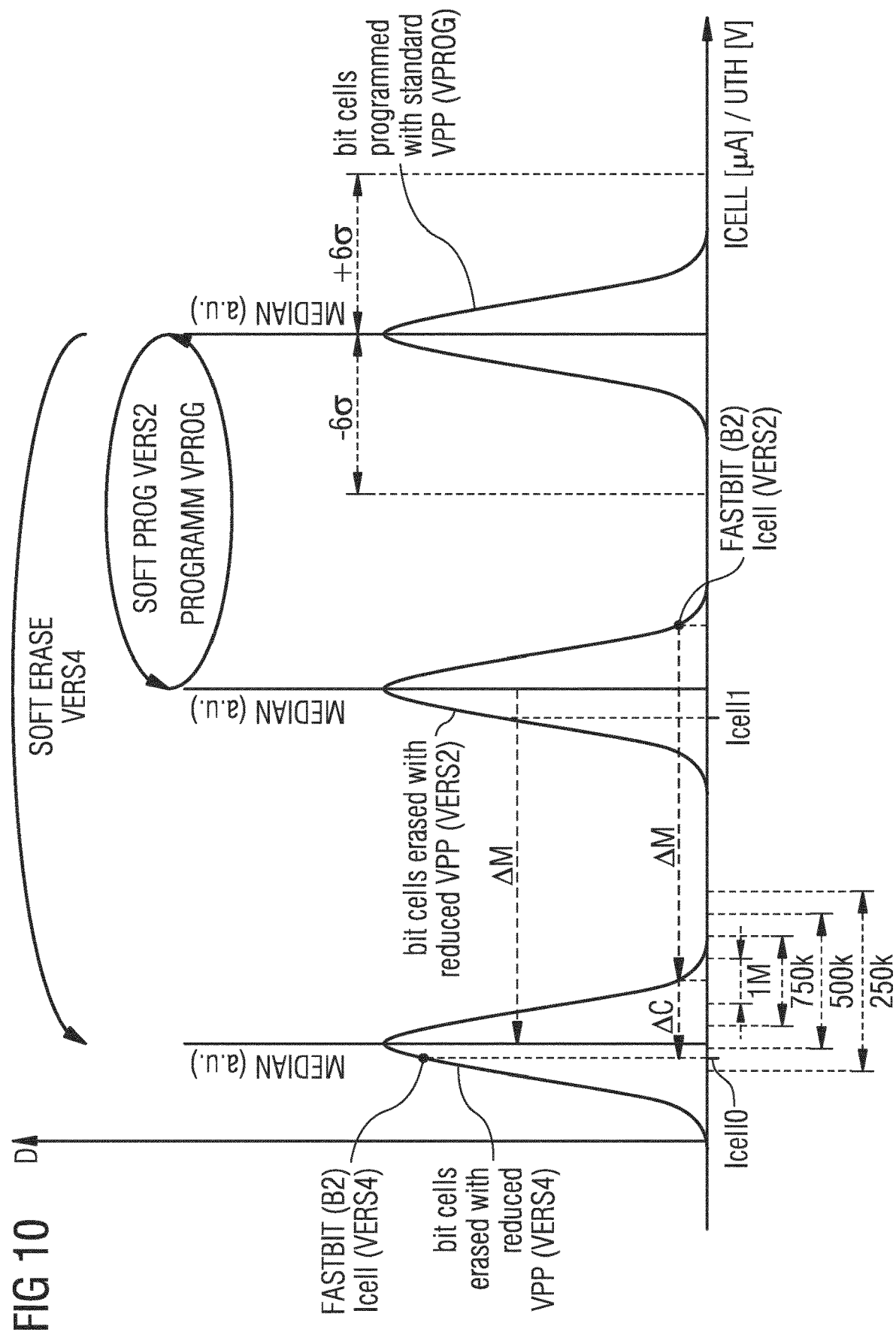

In FIG. 8, a soft erase screening based on two soft erase pulses is demonstrated. In FIG. 9, a soft program screening based on two soft program pulses is shown. In FIG. 10, a soft erase screening based on two soft erase pulses with a standard program pulse in-between is explained. In FIG. 11, a soft program screening based on two soft program pulses with a standard erase pulse in-between is elucidated. In FIGS. 8 to 11, the distribution D is shown as a function of the bit cell current ICELL for three different states.

Referring to FIG. 6, for an efficient screening of fast bit cells which will fail during life time by cycling the NVM plane 2, the memory arrangement 1 is set in an external voltage supply mode (also called external VPP mode) as explained in FIG. 1. Therefore, the main switch 185 and the supply switch 186 are in a conducting state and the first and the second switch 182, 183 and the reference switch 184 are in a non-conducting state. The switches 182 to 186 are controlled with the associated control signals T1 to T5 driven from test control unit 170. The production test equipment has now full control on the voltage at the high voltage node 153 of the memory arrangement 1 and as a first step of the screening a standard program pulse is applied to the NVM plane 2. The standard program pulse uses the same level and timing on the supply voltage VPP namely the value VPROG as the internal charge pump 151 would provide for typical program condition. Depending on the used technology it is taken care that all bit cells in the NVM plane 2 are programmed. As some technologies are data sensitive for programming a special test mode is used which is capable of programming both NVM bit cells 20, 21 forming one data bit. The standard readout with the sense amplifier arrangement 100 would lead to an unreliably result because both bit cells 20, 21 have the same status (programmed). As there is no difference between the two bit cells 20, 21 the offset and noise of the sense amplifier arrangement 100 defines the output result.

To judge the programming state of each bit cell 20, 21, the test equipment switches in a second step of the screening to an external reference current mode by setting the supply switch 186 in a non-conducting state and the reference switch 184 in a conducting state. To check the programming status of each bit cell 20, 21 the exact drain source current ICELL of each bit cell 20, 21 is determined. Thus, for each bit cell a first value Icell1 of the bit cell current ICELL is measured. Therefore, an external reference current IREF which is provided by the not shown test equipment and which is internal distributed to the sense amplifier arrangement 100 is swept in defined steps either from a low to a high value or vice versus depending on the used technology. For simplification a positive ramp is explained.

As a starting point a reference current IREF with a level which is 50% of a good programmed bit cell is applied from the test equipment to the memory arrangement 1 via the test pad 180. All addresses are checked with this current level and the result should be equal to "high" because all bit cells are showing a higher current compared to the external reference current IREF applied to the memory arrangement 1. In case of a fully differential bit cell plane 2 the second bit cell 21 is checked as well by using a special test mode which allows to compare the second bit cell 21. All second bit cells 21 should be "high" as well. After the two readouts of the whole memory with the standard read out speed. The external reference current IREF is increased by a defined step and all bit cells are checked again as described above. The external reference current IREF is increased with the defined step size as long as all bit cells are changing from "high" to "low".

What happens when a bit cell changes its state from "high" to "low": The external reference current IREF is becoming larger compared to the bit cell current ICELL of the bit cell. That means the test equipment measures with this method the value of each bit cell current in the NVM plane 2 and a bit cell current distribution D of the programmed bit cells can be determined as shown in FIG. 6 on the right side of the plot. The accuracy of this method depends on the step size used to increase the external reference current IREF. The value of the step size depends on the used production test equipment (resolution of the current sink), on the noise level of the sense amplifier arrangement 100 and the NVM 1, the defined cycle classes and on the test time. This value will vary for each technology and is found during characterization. Once the current distribution D is measured, a ±6 sigma limit can be applied by the test equipment to filter out weak bit cells. Thus, the weak bit cells are selected in the test phase before an operation phase ("pre" the operating phase) and thus are the preselected bit cells in the operating phase or phases. This approach is addressed to the infant mortality screening of the bit cells; the limits are adapted to the used technology and production line.

As third step the memory arrangement 1 is switched back to the external voltage supply mode and a soft erase pulse is applied to the memory arrangement 1. Care is taken for fully differential NVMs as stated above to erase both bit cells 20, 21 of one data bit. A value VERS1 of the supply voltage VPP is used for the soft erase pulse that is lower compared to the standard erase voltage level. The timing used during erase stays the same as for a standard erase pulse. So only the supply voltage VPP is changed and the timing is fixed. The exact value of the supply voltage VPP during the soft erase pulse depends on the used technology and can be found during characterization.

After the soft erase operation has taken place, the memory arrangement 1 is switched to external reference current mode. The external reference current IREF is again swept from very low value near 10% of a good programmed bit cell. Using the same step size as for checking for the programmed status but now the test equipment checks the status of the erased bit cells. This results in a soft erase bit cell current distribution D shown in FIG. 6 on the left side. Also the ±6 sigma limit is applied to screen out infant mortality failure. Fast bit cells which fail within the defined number of endurance cycles will erase much faster compared to standard manufactured bit cells which leads to a lower bit cell current ICELL. Thus, for each bit cell a second value Icell0 of the bit cell current ICELL is measured.

Of interest now are such fast bit cells and how they can be classified into cycle classes. FIG. 6 shows as an example failure B1 also presented in FIG. 4. This fast bit cell leads to stuck at "low" failure close to 250 k endurance cycles. To screen such bit cells the distribution D of the program and soft erase is measured and the median of both distribution peaks is calculated and the difference of these two currents marked as ΔM in FIG. 6 is monitored. Standard processed bit cells without defects which are capable of full filling the 1M endurance cycles show a shift ΔI in the bit cell current ICELL around ΔM. If bit cells are found showing bigger or lower shift ΔI than ΔM these are candidates for fast bit cells not achieving the maximum number of endurance cycles. Fast bit cell B1 shows an additional shift of ΔC which is inside the bit cell current distribution D and therefore impossible to find for standard screening procedure searching for outliers. Thus, the additional shift ΔC can be calculated according to the equation:

$$\Delta C = \Delta I - \Delta M \text{ or } \Delta C = |\Delta I - \Delta M|$$

$$\Delta I = Icell1 - Icell0$$

wherein ΔI is the difference between the first value Icell1 and the second value Icell0 of the bit cell current ICELL and ΔM is the difference between the median of the first value and the median of the second value of the bit cell current ICELL. Depending on the value of ΔC and the cycle class definition found during characterization, the number of endurance cycles of B1 can be predicted and was found in that case to be smaller than 250 k. Out of the characterization, the ΔC shifts vs the number of passing endurance cycles is extracted to get the correct correlation to the cycle class definition. As the comparison is performed for each address and bit cell, the position of B1 is exactly known in the NVM plane 2. This is the base for the byte replacement strategy explained later.

The screening algorithm calculates for each address and bit cells the ΔC and based on the cycle class definition which gives the limits in terms of Δ current allowed for the different cycle classes, the number of endurance cycles for each bit cell 20, 21 is predicted inside the NVM memory plane 2.

For example, the bit cell is selected as the preselected bit cell, if the difference ΔI between the first value Icell0 and the second value Icell1 of the bit cell current ICELL is outside of a first predetermined current range having an upper limit C1U and a lower limit C1L (with C1L<C1U).

If C1L≤ΔI≤C1U, then the bit cell is not a preselected bit cell.

If ΔI<C1L or ΔI>C1U, then the bit cell is a preselected bit cell.

If only two cycle classes are used, then the preselected bit is used up to a predetermined limit of write cycles which is equal for each preselected bit (the bit cell is set into the "lowest" cycle class). The bit cells which are not preselected are used up to the end of the lifetime of the memory arrangement 1 (the bit cell is classified into the "highest" cycle class).

If three cycle classes are used, then the preselected bit has to be classified into two cycle classes. If the difference ΔI is outside of the first predetermined current range having an upper limit C1U and a lower limit C1L and inside a second range having an upper limit C2U and a lower limit C2L, then the predetermined limit of the write cycles has a first value (the bit cell is set into a "medium" cycle class). If the difference ΔI is outside of the second predetermined current range, the predetermined limit of the write cycles has a second value that is smaller than the first value (the bit cell is set into the "lowest" cycle class).

If C1L≤ΔI≤C1U, then the bit cell is not a preselected bit cell.

If C2L<ΔI<C1L or C2U>ΔI>C1U, then the bit cell is a preselected bit cell having the first value of the predetermined limit.

If ΔI<C2L or ΔI>C2U, then the bit cell is a preselected bit cell having the second value of the predetermined limit.

If more than three cycle classes are used, then corresponding equations are used.

Depending on the defect a fast erase bit cell is not necessarily a fast programming bit cell. So also the opposite direction is checked to screen safely out fast programming bit cells showing no degradation on the soft erase test.

As shown in FIG. 7, the test equipment applies a standard erase pulse with a value VERS of the supply voltage VPP in the external voltage supply mode, then the distribution D of the bit cell current ICELL of the erased bit cells (left distribution peak in FIG. 7) is measured. Thus, for each bit cell a first value Icell1 of the bit cell current ICELL is measured. Again by applying the ±6 sigma limit the test equipment screens for infant mortality.

Next step is to switch back to the external voltage supply mode and apply a soft programming pulse with a value VPROG1 of the supply voltage VPP. With the external reference current mode the soft programming current distribution D is measured shown in FIG. 7 on the right side and screen out the infant mortality. Thus, for each bit cell a second value Icell0 of the bit cell current ICELL is measured. For both peaks of the distribution D the median value of the bit cell current ICELL is calculated and is shown as ΔM in the plot. B3 may be an example for fast bit cells, since B3 leads to a stuck at "high" failure near 750 k endurance cycles. ΔC is becoming smaller compared to failure B1 and defines B3 to the cycle class 500 k.

After executing the fast erase and fast program test, the test equipment finally finds all fast bit cells which are not capable of fulfilling the maximum number of endurance cycles. These bit cells as will be seen later are the preselected bits which then are replaced dynamically by a byte replacement strategy to achieve the endurance specification.

The classification of a bit cell as a preselected bit and a not preselected bit and the classification into the cycle classes using the pulse sequences described in FIGS. 7 to 11 can be performed similarly to the method described with FIG. 6. In FIGS. 7, 9 and 11, the difference ΔI=Icell1−Icell0 may be negative and the amount |ΔI| of the difference ΔI may be inserted into the equations instead of the difference ΔI.

FIG. 8 describes a second possible way to screen for fast erase bit cells. The test equipment starts with the same procedure as explained in FIG. 6. The bit cells are programmed with a standard pulse having the value VPROG of the supply voltage VPP in the external voltage supply mode. Next the bit cell current distribution D is measured in the external reference current mode and the infant mortality are filtered out by applying the ±6 sigma limit (right peak of the distribution D in FIG. 8). Next a soft erase pulse is performed with a value VERS2 of the supply voltage VPP and again the bit cell current distribution D is measured in the external reference current mode shown in FIG. 8 as the distribution D in the middle of the plot. It is not required to apply the ±6 sigma limit for that approach as described below.

Next step is again a soft erase pulse with the supply voltage VPP having a value VERS3 lower than the value VERS2. Both soft erase voltages VERS2 and VERS3 are chosen in a way that no overlap of all three bit cell current distributions D shown in FIG. 8 is achieved. The exact values are dependent on the used technology and failure modes. After the second soft erase pulse the test equipment switches back to the external reference current mode and the bit cell current distribution D of the second soft erase step is measured. For both soft erase pulses the median value and the ΔM current is calculated. As a fast bit cell example B2 is chosen which leads to a stuck at "low" fast bit cell fail close to 500 k. Again a ΔC current is determined which classifies B2 as a 250 k endurance candidate.

When one compares the approach from FIG. 8 with the test in FIG. 6, one can see that the test equipment compares now two soft erase pulses which leads to a better sensitivity as both operations are of the same type. Depending on the technology a standard program pulse can cover the NVM element when the bit cells has additional transistors integrated, like select transistors, which can limit the bit cell current ICELL. One may ensure that the NVM element, namely the bit cell is the mean contributor on the bit cell current ICELL to enable a safe screening. As two soft erase pulses are compared, the ±6 sigma limit is not needed because the ΔC measurement will also screen safely for infant mortality fails. To save test time the test equipment still sticks with the ±6 sigma limit on the standard program pulse at the beginning of the test as described above to filter out fatal failure.

To check the second polarity of the NVM bit cell, the test equipment tests for fast programming bit cells as described in FIG. 9. A first step is to apply a standard erase pulse with the value VERS of the supply voltage VPP. The current distribution is measured with the external reference current routine (left current distribution in FIG. 9). The ±6 sigma limit filters out fatal failures. The first soft programming pulse with the value VPROG2 of the supply voltage VPP is applied next to the NVM plane 2 and the bit cell current distribution D is measured with the external reference current IREF (middle distribution FIG. 9). Again a soft program pulse with the value VPROG3 of the supply voltage VPP is executed and the second soft program bit cell current distribution D is measured (right distribution FIG. 9) with the external reference current mode. The ΔM of the median values is calculated and as an example for a fast bit cell B4 is shown in FIG. 9. B4 will lead to a stuck at "high" failure near the 1M endurance cycles and is classified as 750 k. As seen from the plot ΔC is small compared to B2. The failure close to the maximum specified number of endurance cycles are the most difficult to screen. The ±6 sigma limit is not needed for the same reason as explained above, since the infant mortality bit cells are safely screened with this method. The exact values VPROG2 and VPROG3 of the supply voltage VPP are defined by the technology and are chosen to have no overlap between the three current distribution peaks.

Having a closer look to the test described in FIG. 8, it can be seen that the test equipment executes two soft erase pulses in series. The second soft erase pulse starts from the level of the first soft erase pulse. There is also the possibility to make a standard program pulse after the first soft erase pulse and execute the second soft erase pulse after the additional programming pulse has been applied. FIG. 10 shows the flow for this screening procedure. The difference is that the test equipment starts for both soft erase pulses from the same level (standard programmed bit cells) and, therefore, the results are better comparable. This mainly depends on how the characterization was done.

The procedure shown in FIG. 8 has a charge accumulation on the floating gate that takes place because there is already a charge on the floating gate before the second soft erase pulse is started. To get comparable results between these two screening algorithm the value VERS3 will be different compared to the value VERS4. The value of difference between the two voltages depends on the amount of charge which is already on the floating gate for the screening described in FIG. 8. For different technologies different delta voltages are achieved between the values VERS3 and VERS4. The erase fast bit cell screening based on FIG. 10 starts with a standard program pulse VPROG followed by a bit cell current distribution measurement using the external reference current mode. The ±6 sigma limit screens out fatal failure. Next step is a soft erase pulse with the value VERS2 of the supply voltage VPP followed by a bit cell current distribution measurement. So far all steps are equal to the test procedure shown in FIG. 8. After the bit cell current measurement a standard program pulse with the value VPROG of the supply voltage VPP is applied to the memory arrangement 1. There is no need to run an additional bit cell current distribution measurement. After the standard program step a soft erase pulse with the value VERS4 of the supply voltage VPP is executed and the bit cell current distribution D is measured for the second soft erase pulse. Out of both soft erase distributions, the ΔM of the median currents are calculated. As fast bit cell example B2 was chosen to make this screening approach more comparable to FIG. 8.

The check of the second polarity is done in a similar way and described in FIG. 11. The algorithm starts with a standard erase pulse with the value VERS of the supply voltage VPP followed by the bit cell current distribution measurement and the fatal error screening with the ±6 sigma limit. The first soft program pulse with the value VPROG2 of the supply voltage VPP followed by the bit cell current distribution measurement is the same as in FIG. 9. To reset the charge on the floating gate a standard erase pulse with the value VERS of the supply voltage VPP is executed next. The second soft program pulse with the value VPROG4 of the supply voltage VPP and the bit cell current distribution measurement are the next tests to be executed. Out of both bit cell current distributions the ΔM of the median is calculated and for each bit cell in the memory the differences ΔC are derived. As fast bit cell example B4 is chosen and shows the same results as in FIG. 9.

All three different screening methods are capable of screening fast bit cells which will not withstand the maximum number of endurance cycles the NVM technology can safely provide. All screening methods are able to find the exact location of the fast bit cells in the NVM plane 2 and can classify the fast bit cells according the defined cycle classes. With these inputs to the screening algorithm a replacement strategy can be implemented to overcome the yield loss which one will face if no replacement strategy is present. Which screening algorithm fits best is mainly defined from the used technology, the production line, the production test equipment and the test time. It is also possible having no replacement methodology at all to save area which makes sense for standard products where different cycle classes can be sold to the market. The replacement strategy is the better choice in systems in which the memory arrangement 1 is embedded.

Based on the endurance failure rate shown in FIG. 5 and the size of the memory the needed number of replacement bit cells 50 to 55, 60 to 65 can be calculated. The achievable values are mainly depending on the used NVM technology and the defect density of the production line. As seen in FIG. 4 not many NVM bit cells will fail before the wear out region starts. In the shown example, four bit cell will not achieve the 1M endurance cycles and, therefore, will be replaced safely to reach the specified target. On the other hand the area overhead by introducing a replacement strategy showed to be small to have a significant outperformance against a standard ECC technique. Advantageously, no additional columns may be added to the memory. Adding a column means that this new bit cells need to be placed in an additional high voltage well which has three mean disadvantages. First a high voltage well has a minimum defined width adding additional area to the memory. Second the well spacing between two high voltages wells is rather big, again resulting in an area increase. Number three is the need of an additional y-address. All drawbacks may be avoided, if only world lines 88, 89 are added to the memory arrangement 1 for replacing weak bit cells.

An additional simplification is to replace a whole byte instead a single bit cell which leads to a much simpler address replacement handling. As no additional y decoding is present, additional word lines 88, 89 may be added to overcome that problem. For the shown example with four failures, four word lines are added because all four failures can occur in the same well. There is also the possibility that the replacement bit cells are having a defect. Therefore additional word lines are added to safely screen for such defects. In the shown example, two replacement word lines 89, 89 will solve that issue. So in total six replacement word lines 88, 89 are needed to ensure that the memory arrangement 1 is able to withstand 1M endurance cycles.

The invention claimed is:

1. A memory arrangement, comprising
a non-volatile memory plane,
a replacement plane,
an address select block, and
a counter arrangement comprising a first number N of counters,
wherein the non-volatile memory plane comprises a second number M of preselected bit cells with the second number M equal or smaller than the first number N,
wherein one of the first number N of counters is incremented at a write cycle of a corresponding preselected bit cell of the second number M of preselected bit cells and the address select block switches from the preselected bit cell to a corresponding replacement bit cell of the replacement plane, if the counter value of said counter is higher than a predetermined limit corresponding to said preselected bit cell,
wherein the memory arrangement comprises an address replacement plane for storing the addresses of the second number M of preselected bit cells,
wherein the addresses of the second number M of preselected bit cells are determined in a test phase, the test phase is before an operation phase and the preselected bit cells are not changed in the operation phase,
wherein an erase test is performed in the test phase,
wherein the erase test of a bit cell (20) is performed by programming the bit cell (20),
determining a first value (Icell1) of a bit cell current (ICELL) flowing through the bit cell (20),
providing an erase pulse to the bit cell (20),
determining a second value (Icell0) of the bit cell current (ICELL) flowing through the bit cell (20) and
setting the bit cell (20) as a preselected bit cell, if a difference (ΔI) between the first value (Icell1) and the second value (Icell0) of the bit cell current (ICELL) is outside of a first predetermined current range.

2. The memory arrangement according to claim 1,
wherein the address replacement plane stores an information about the second number M of predetermined limits.

3. The memory arrangement according to claim 2,
wherein at least two of the second number M of predetermined limits are different.

4. The memory arrangement according to claim 1,
wherein the memory arrangement is configured to replace a byte of the non-volatile memory plane comprising the preselected bit cell by a byte of the replacement plane comprising the replacement bit cell.

5. A method for operating a memory arrangement, comprising
storing information in a non-volatile memory plane in a write cycle, wherein the non-volatile memory plane comprises a second number M of preselected bit cells,
counting the write cycle by one of a first number N of counters of a counter arrangement at a write cycle of a corresponding preselected bit cell of the second number M of preselected bit cells with the second number M equal or smaller than the first number N, and
storing further information in a corresponding replacement bit cell of a replacement plane, if a counter value of said counter is higher than a predetermined limit corresponding to said preselected bit cell of the second number M of preselected bit cells, and in the non-volatile memory plane, if the counter value of said counter is equal or lower than the predetermined limit,
wherein the memory arrangement comprises an address replacement plane that stores the addresses of the second number M of preselected bit cells,
wherein the addresses of the second number M of preselected bit cells are determined in a test phase, the test phase is before an operation phase and the preselected bit cells are not changed in the operation phase,
wherein an erase test of a bit cell is performed in the test phase by
programming the bit cell,
determining a first value of a bit cell current flowing through the bit cell,
providing an erase pulse to the bit cell,
determining a second value of the bit cell current flowing through the bit cell and
setting the bit cell as a preselected bit cell, if a difference between the first value and the second value of the bit cell current is outside of a first predetermined current range.

6. The method according to claim 5,
wherein an information about a predetermined limit of write cycles is stored for the preselected bit cell in the address replacement plane depending on the result of erase test and/or on the result of the program test of the preselected bit cell.

7. The method according to claim 6,
wherein the predetermined limit of write cycles has a first value, when the difference is outside of the first predetermined current range and inside a second predetermined current range, and the predetermined limit of write cycles has a second value that is smaller than the first value, when the difference is outside of the second predetermined current range.

* * * * *